United States Patent
Shin et al.

(10) Patent No.: US 12,232,386 B2
(45) Date of Patent: *Feb. 18, 2025

(54) TRANSPARENT DISPLAY DEVICE

(71) Applicant: LG Display Co., Ltd., Seoul (KR)

(72) Inventors: KiSeob Shin, Paju-si (KR); ChangSoo Kim, Paju-si (KR); EuiTae Kim, Paju-si (KR); Soyi Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/470,219

(22) Filed: Sep. 19, 2023

(65) Prior Publication Data

US 2024/0008334 A1      Jan. 4, 2024

Related U.S. Application Data

(63) Continuation of application No. 17/129,047, filed on Dec. 21, 2020, now Pat. No. 11,800,766.

(30) Foreign Application Priority Data

Dec. 27, 2019   (KR) .......................... 10-2019-0176454

(51) Int. Cl.
*H10K 59/131*   (2023.01)
(52) U.S. Cl.
CPC ................ *H10K 59/1315* (2023.02)
(58) Field of Classification Search
CPC .............. H10K 59/351–353; H10K 59/1315
See application file for complete search history.

(56) References Cited

U.S. PATENT DOCUMENTS

| | | | |
|---|---|---|---|
| 7,321,409 B2 | 1/2008 | Murai et al. | |
| 8,324,916 B2 | 12/2012 | Hayashi | |
| 11,800,766 B2 * | 10/2023 | Shin | H10K 59/121 |
| 2011/0291119 A1 * | 12/2011 | Ryu | H10K 59/131 |
| | | | 257/E27.121 |
| 2015/0255493 A1 | 9/2015 | Shim et al. | |
| 2017/0110521 A1 * | 4/2017 | Park | H10K 59/131 |

(Continued)

FOREIGN PATENT DOCUMENTS

| | | |
|---|---|---|
| EP | 3193322 A1 | 7/2017 |
| EP | 3343631 A1 | 7/2018 |

(Continued)

*Primary Examiner* — Eric K Ashbahian
(74) *Attorney, Agent, or Firm* — Seed IP Law Group LLP

(57) ABSTRACT

A transparent display device is disclosed, which may improve transmittance in a non-display area and at the same reduce resistance of power lines. The transparent display device includes a substrate provided with a display area, in which a plurality of subpixels are disposed, and a non-display area adjacent to the display area. The device includes a plurality of power lines provided in the non-display area over the substrate and extended in parallel in a first direction. The display area includes first non-transmissive areas provided with the plurality of subpixels and a first transmissive area provided between the first non-transmissive areas, the non-display area includes second non-transmissive areas provided with the plurality of power lines and a second transmissive area provided between the second non-transmissive areas.

18 Claims, 12 Drawing Sheets

(56) References Cited

U.S. PATENT DOCUMENTS

| | | | |
|---|---|---|---|
| 2017/0194415 A1 | 7/2017 | Choi et al. | |
| 2019/0081129 A1* | 3/2019 | Sung | H10K 59/873 |
| 2019/0131365 A1 | 5/2019 | Jung | |
| 2019/0267363 A1 | 8/2019 | Bower et al. | |
| 2020/0381508 A1* | 12/2020 | Jeon | H10K 59/87 |
| 2021/0134785 A1* | 5/2021 | Yang | H01L 23/528 |
| 2021/0193017 A1* | 6/2021 | Ahn | G09G 3/3275 |

FOREIGN PATENT DOCUMENTS

| | | |
|---|---|---|
| EP | 3506361 A1 | 7/2019 |
| EP | 3576157 A2 | 12/2019 |
| KR | 10-2018-0052825 A | 5/2018 |
| TW | 200405071 A | 4/2004 |
| TW | 200633573 A | 9/2006 |

\* cited by examiner

TRANSPARENT DISPLAY DEVICE

CROSS REFERENCE TO RELATED APPLICATION

This application is a continuation of U.S. patent application Ser. No. 17/129,047, filed Dec. 21, 2020; which claims the benefit of Korean Patent Application No. 10-2019-0176454, filed on Dec. 27, 2019, which is hereby incorporated by reference for all purposes as if fully set forth herein.

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recent, studies for transparent display devices for allowing a user to look at objects or image arranged on an opposite side of a display device after transmitting the display device are actively ongoing.

A transparent display device may include a display area on which an image is displayed, and a non-display area. A plurality of signal lines or connection electrodes may be disposed in the non-display area. In the transparent display device, the plurality of signal lines or connection electrodes may be formed of a transparent metal material to enhance transmittance in the non-display area. However, since the transparent metal material generally has high resistance, the transparent display device has a problem in that resistance of the plurality of signal lines or connection electrodes disposed in the non-display area is increased.

Meanwhile, in the transparent display device, the plurality of signal lines or connection electrodes may be formed of a metal material having low resistance to reduce their resistance.

BRIEF SUMMARY

The inventors of the present disclosure recognized that to reduce resistance, an opaque metal material is generally used. The inventors have further appreciated that using a low resistance opaque metal material causes the transparent display device to have a low transmittance in the non-display area. Having recognized this problem, one or more embodiments of the present disclosure provides a transparent display device improves transmittance in a non-display area and at the same time reduce resistance of power lines. This cures one or more problems in the related art including the above identified problem.

Further embodiments of the present disclosure provides a transparent display device that may reduce or minimize recognition of a non-display area.

In addition to the technical benefits of the present disclosure as mentioned above, additional benefits and features of the present disclosure will be clearly understood by those skilled in the art from the following description of the present disclosure.

In accordance with an aspect of the present disclosure, the above and other benefits can be accomplished by the provision of a transparent display device. One embodiment of the transparent display device includes a substrate provided with a display area, in which a plurality of subpixels are disposed, and a non-display area adjacent to, and in some embodiments surrounding the display area, and a plurality of power lines provided in the non-display area on the substrate and extended in parallel in a first direction. The display area includes first non-transmissive areas provided with the plurality of subpixels and a first transmissive area provided between the first non-transmissive areas, the non-display area includes second non-transmissive areas provided with the plurality of power lines and a second transmissive area provided between the second non-transmissive areas. The first transmissive area and the second transmissive area have the same shape.

In accordance with another aspect of the present disclosure, the above and other benefits can be accomplished by the provision of a transparent display device including a substrate provided with a display area, in which a plurality of subpixels are disposed, a first non-display area on which a pad is disposed, and a second non-display area disposed in parallel with the first non-display area by interposing the display area, an anode electrode provided in each of the plurality of subpixels on the substrate, a light emitting layer provided on the anode electrode, a cathode electrode provided on the light emitting layer, and a plurality of first common power lines provided in the second non-display area on the substrate and electrically connected with the cathode electrode. The second non-display area includes a second non-transmissive area provided with the plurality of first common power lines and a second transmissive area provided between the plurality of first common power lines.

According to the present disclosure, the plurality of power lines may be provided in the non-display area, and the transmissive area may be provided between the plurality of common lines. As the transmissive area is provided in the non-display area, transmittance in the non-display area may be improved.

Also, according to the present disclosure, as the transmissive area provided in the non-display area and the transmissive area provided in the display area have the same shape, transmittance similar to that in the display area may be embodied in the non-display area.

Moreover, according to the present disclosure, color filters are provided in the non-display area and patterned in the same shape as that of color filters provided in the display area, whereby a difference between transmittance in the non-display area and transmittance in the display area may be reduced or minimized. Therefore, recognition of the non-display area may be reduced or minimized.

Also, according to the present disclosure, as the power lines provided in the non-display area are formed of a plurality of metal layers, their total area may be increased. Therefore, even though each of the power lines is formed with a narrow width, resistance may be prevented from being increased.

Also, according to the present disclosure, each of the metal lines provided between the pad area and the display area, for example, a common power line and a reference line may electrically be connected with the pad by using two connection electrodes disposed on their respective layers different from each other. Therefore, according to the present disclosure, a total area of each of the common power line and the reference line may be increased, and resistance thereof may be reduced.

Also, according to the present disclosure, even though a defect occurs in any one of two connection electrodes, the metal line and the pad may be connected with each other by the other one of the two connection electrodes. Therefore, a voltage may stably be supplied to the subpixels, and panel yield may be improved.

Also, according to the present disclosure, a defect of a driving transistor may be tested before the anode electrode is deposited. Since a repair process may be performed before the anode electrode is deposited, repair yield may be prevented from being reduced by the anode electrode. Also, a tact time may be reduced.

In addition to the effects of the present disclosure as mentioned above, additional advantages and features of the present disclosure will be clearly understood by those skilled in the art from the above description of the present disclosure.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
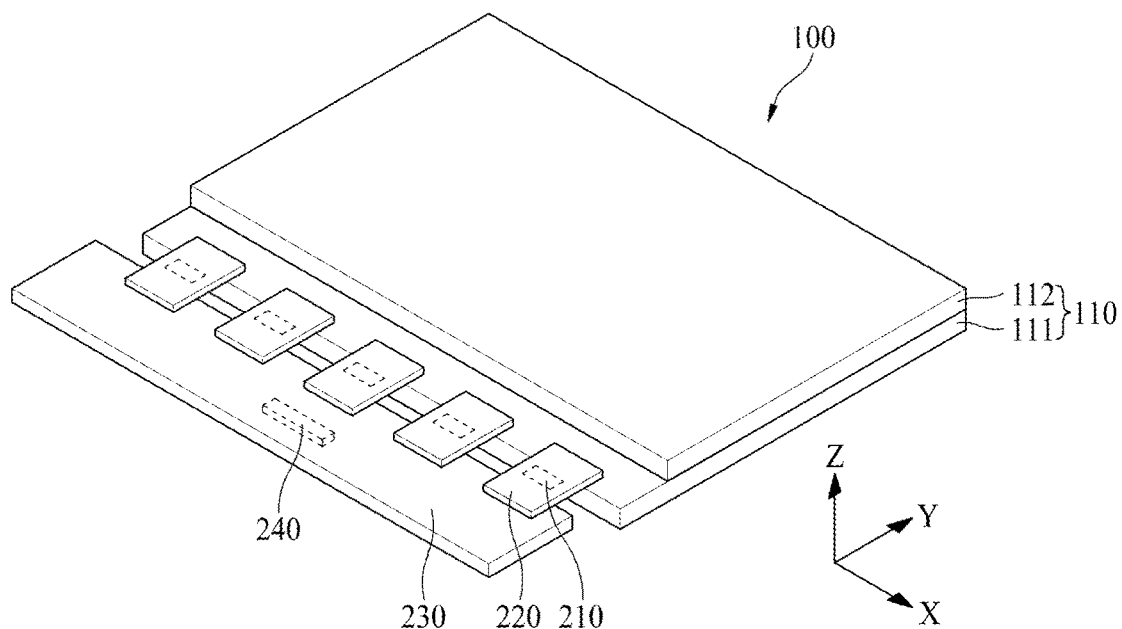
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may indirectly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X axis indicates a line parallel with a gate line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device (LCD), a plasma display panel (PDP), a Quantum dot Light Emitting Display (QLED) or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The gate driver supplies gate signals to the gate lines in accordance with a gate control signal which is provided from the timing controller 240. The gate driver may be provided in one side of the display area of the transparent display panel 110, or the non-display area of both peripheral sides of the transparent display panel 110 by a gate driver in panel (GIP) method. In another way, the gate driver may be manufactured in a driving chip, may be mounted on the flexible film, and may be attached to one side of the display area of the transparent display panel 110, or the non-display area of both peripheral sides of the transparent display panel 110 by a tape automated bonding (TAB) method.

The source drive IC 210 receives digital video data and source control signals from the timing controller 240. The source drive IC 210 converts the digital video data into analog data voltages in accordance with the source control signal, and supplies the analog data voltages to the data lines. If the source drive IC 210 is manufactured in a driving chip, the source drive IC 210 may be mounted on the flexible film 220 by a chip on film (COF) method or a chip on plastic (COP) method.

Pads, such as power pads and data pads, may be formed in a non-display area of the transparent display panel 110. Lines connecting the pads with the source drive IC 210 and lines connecting the pads with lines of the circuit board 230 may be formed in the flexible film 220. The flexible film 220 may be attached onto the pads using an anisotropic conducting film, whereby the pads may be connected with the lines of the flexible film 220.

Figure 2:
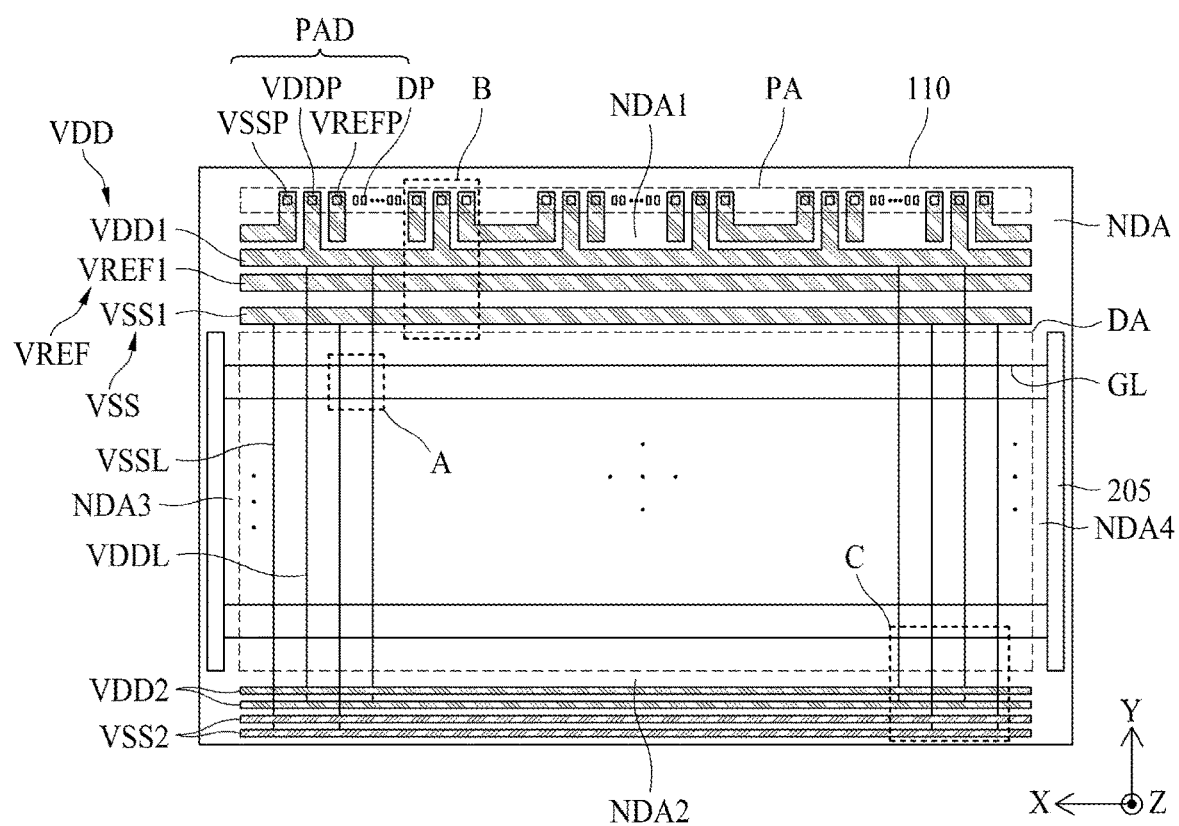
FIG. 2 is a schematic plane view illustrating a transparent display panel.
Figure 3:
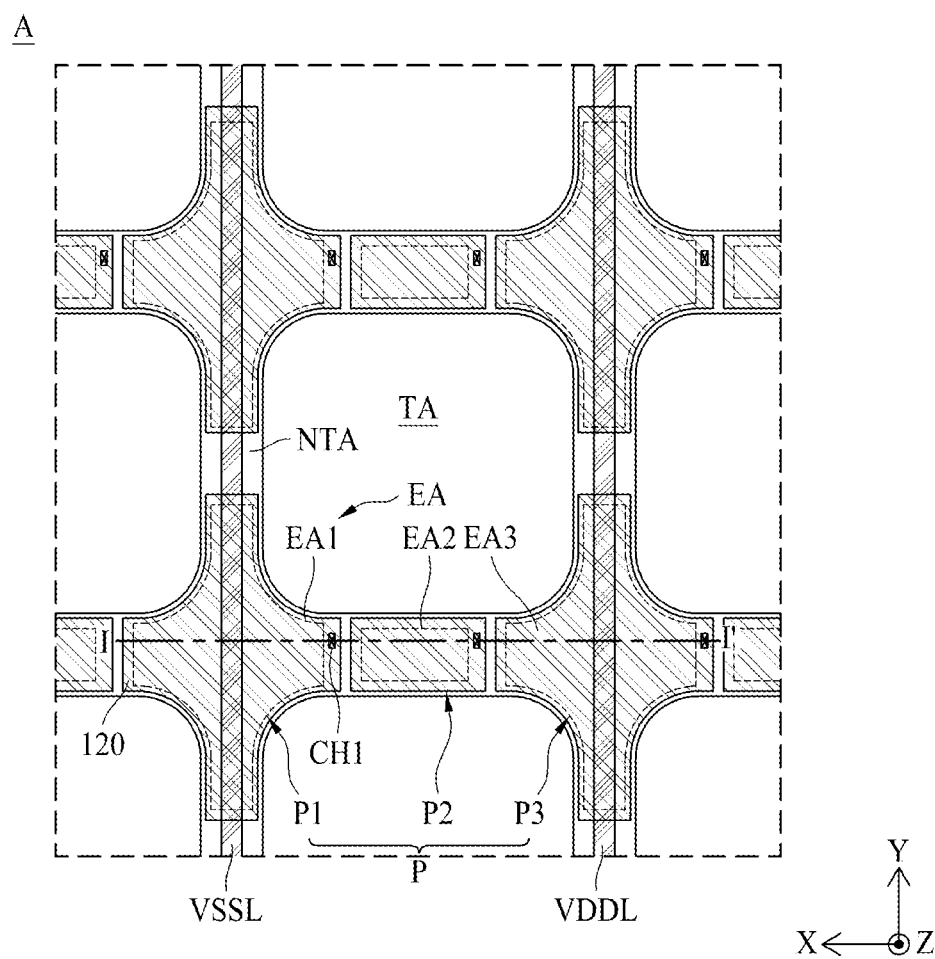
FIG. 3 is an enlarged view of an area A in FIG. 2.
Figure 4:
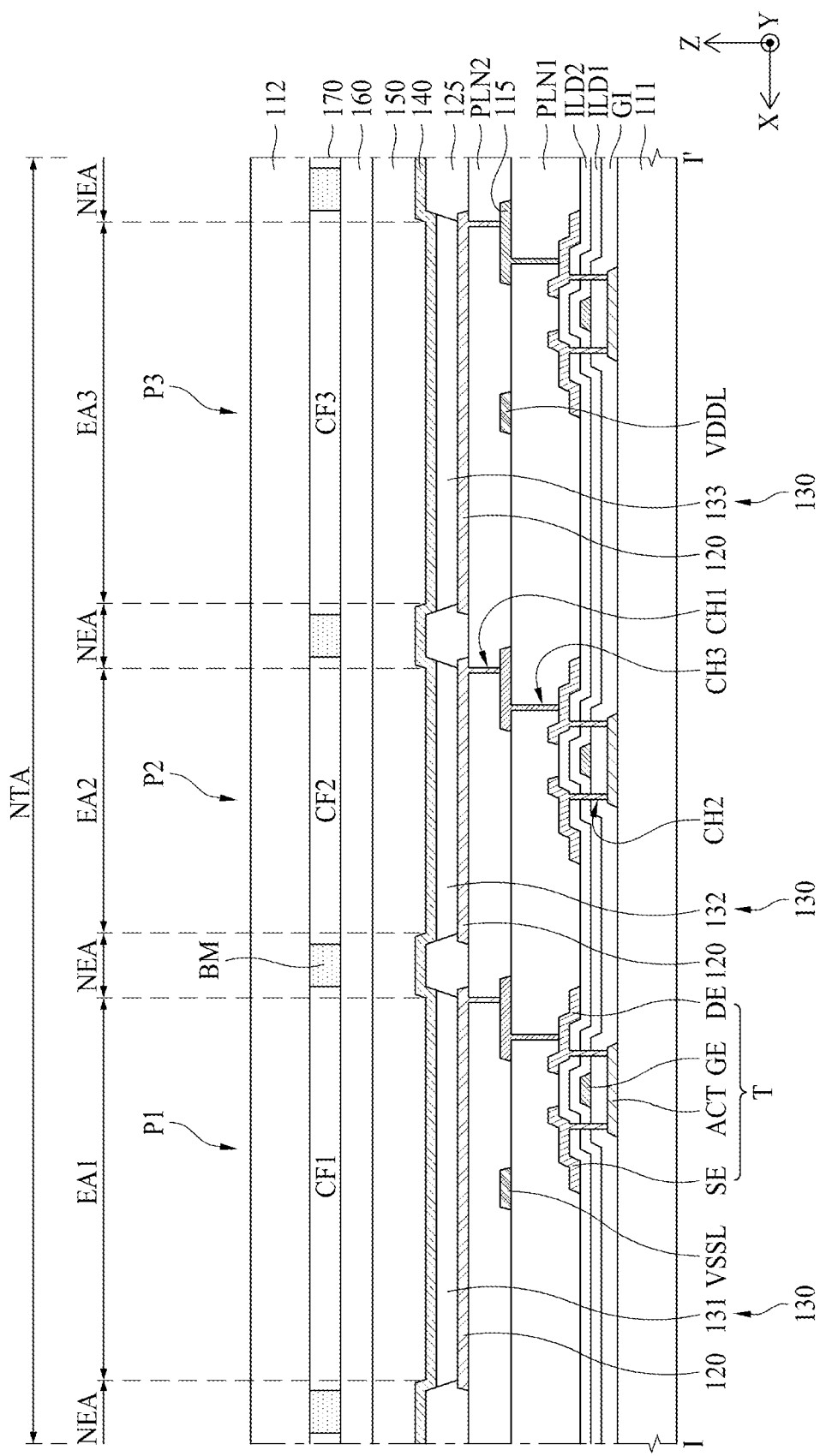
FIG. 4 is a cross-sectional view taken along line I-I' of FIG. 3.

FIG. 2 is a schematic plane view illustrating a transparent display panel, FIG. 3 is an enlarged view of an area A in FIG. 2, FIG. 4 is a cross-sectional view taken along line I-I' of FIG. 3.

The substrate 111 may include a display area DA where pixels P are formed to display an image, and a non-display area NDA that does not display an image.

The display area DA, as shown in FIG. 3, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, 90%, and the non-transmissive area NTA may be an area where light transmittance is smaller than β%, for example, 50%. In some embodiments, a is greater than β. A user may view an object or background arranged on a rear surface of the transparent display panel 110 due to the transmissive area TA.

The non-transmissive area NTA may be provided with pixel power lines VDDL, common power lines VSSL, reference lines, data lines, gate lines GL, and pixels P.

The gate lines GL may be extended in a first direction (e.g., X axis direction), and may cross (or overlap) the pixel power lines VDDL, the common power lines VSSL and the data lines in the display area DA.

The pixel power lines VDDL, the common power lines VSSL, the reference lines and the data lines may be extended in a second direction (e.g., Y axis direction). In some embodiments, the pixel power lines VDDL and the common power lines VSSL may alternately be disposed in the display area DA. The transmissive area TA may be disposed between the pixel power line VDDL and the common power line VSSL.

The pixels P emit predetermined light to display an image. An emission area EA may correspond to an area, from which light emits, in the pixel P.

Each of the pixels P may include a first subpixel P1, a second subpixel P2, and a third subpixel P3. The first subpixel P1 may be provided to include a first emission area EA1 emitting green light, the second subpixel P2 may be provided to include a second emission area EA2 emitting red light, and the third subpixel P3 may be provided to include a third emission area EA3 emitting blue light, but these subpixel are not limited thereto. Each of the pixels P may further include a subpixel emitting white light W. An arrangement sequence of the subpixel P1, P2, and P3 may be changed in various ways.

Hereinafter, for convenience of description, a description will be given based on that the first subpixel P1 is a green subpixel emitting green light, the second subpixel P2 is a red subpixel emitting red light, and the third subpixel P3 is a blue subpixel emitting blue light.

Each of the first subpixel P1, the second subpixel P2, and the third subpixel P3, as shown in FIG. 4, may include a circuit element that includes a capacitor, a thin film transistor, and a light emitting diode. The thin film transistor may include a switching transistor, a sensing transistor, and a driving transistor T.

The switching transistor is switched in accordance with a gate signal supplied to the gate line GL and serves to supply a data voltage supplied from the data line to the driving transistor T.

The sensing transistor serves to sense a threshold voltage deviation of the driving transistor T, which is a cause of image quality degradation.

The driving transistor T is switched in accordance with the data voltage supplied from the switching transistor to generate a data current from a power source supplied from the pixel power line VDDL, and serves to supply the generated data current to the anode electrode 120 of the pixel.

The driving transistor T includes an active layer ACT, a gate electrode GE, a source electrode SE, and a drain electrode DE.

In detail, the active layer ACT may be provided over the first substrate 111. The active layer ACT may be formed of a silicon based semiconductor material or an oxide based semiconductor material. A buffer layer (not shown) may be provided between the active layer ACT and the first substrate 111.

A gate insulating layer GI may be provided over the active layer ACT. The gate insulating layer GI may be formed an inorganic film, for example, a silicon oxide (SiOx) film, a silicon nitride (SiNx) film, or a multi-layered film of SiOx and SiNx.

A gate electrode GE may be provided over the gate insulating layer GI. The gate electrode GE may be formed of a single layer or a multi-layer made of any one of Mo, Al, Cr, Au, Ti, Ni, Nd, and Cu or their alloy.

A first inter-layer insulating layer ILD1 and a second inter-layer insulating layer ILD2 may be provided over the gate electrode GE. The first inter-layer insulating layer ILD1 and the second inter-layer insulating layer ILD2 may be formed an inorganic layer, for example, a silicon oxide (SiOx) layer, a silicon nitride (SiNx) layer, or a multi-layered layer of SiOx and SiNx.

Source and drain electrodes SE and DE may be provided over the second inter-layer insulating layer ILD2. One of the source and drain electrodes SE and DE may be connected to the active layer ACT through a second contact hole CH2 that passes through the gate insulating layer GI and the first and second inter-layer insulating layers ILD1 and ILD2.

The source and drain electrodes SE and DE may be formed of a single layer or a multi-layer made of any one of Mo, Al, Cr, Au, Ti, Ni, Nd, and Cu or their alloy.

A first planarization layer PLN1 may be provided over the source and drain electrodes SE and DE to planarize a step difference caused by the driving transistor T. The first planarization layer PLN1 may be formed of an organic layer, for example, acryl resin, epoxy resin, phenolic resin, polyamide resin, polyimide resin, etc.

An anode auxiliary electrode 115 may be provided over the first planarization layer PLN1. The anode auxiliary electrode 115 may be connected to one of the source and drain electrodes SE and DE through a third contact hole CH3 that passes through the first planarization layer PLN1. For example, the anode auxiliary electrode 115 may be connected to the drain electrode DE through the third contact hole CH3 that passes through the first planarization layer PLN1.

The anode auxiliary electrode 115 may be formed of a single layer or a multi-layer made of any one of Mo, Al, Cr, Au, Ti, Ni, Nd, and Cu or their alloy.

A second planarization layer PLN2 may be formed over the anode auxiliary electrode 115. The second planarization layer PLN2 may be formed of an organic layer, for example, acryl resin, epoxy resin, phenolic resin, polyamide resin, polyimide resin, etc.

Light emitting diodes, which are comprised of the anode electrode 120, a light emitting layer 130, and a cathode electrode 140, and a bank 125 are provided over the second planarization layer PLN2.

The anode electrode 120 may be provided for each of the subpixels P1, P2 and P3. The anode electrode 120 is not provided in the transmissive area TA.

The anode electrode 120 may be connected with the driving transistor T. In detail, the anode electrode 120 may be connected to the anode auxiliary electrode 115 through a first contact hole CH1 that passes through the second planarization layer PLN2. Since the anode auxiliary electrode 115 is connected to the source electrode SE or the drain electrode DE of the driving transistor T through the third contact hole CH3, the anode electrode 120 may electrically be connected with the driving transistor T.

The anode electrode 120 may be formed of a metal material of high reflectivity such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO. The Ag alloy may be an alloy of silver (Ag), palladium (Pb), and Copper (Cu).

A bank 125 may be provided over a second planarization layer PLN2. Also, the bank 125 may be formed to cover each edge of the anode electrode 120 and partially expose the anode electrode 120. Therefore, the bank 125 may prevent light emitting efficiency from being deteriorated due to a current concentrated on the ends of anode electrode 120.

The bank 125 may respectively define emission areas EA1, EA2, and EA3 of the subpixels P1, P2, and P3. Each of the emission areas EA1, EA2, and EA3 of the subpixels P1, P2, and P3 indicates an area where the anode electrode 120, the light emitting layer 130 and the cathode electrode 140 are sequentially deposited and then holes from the anode electrode 120 and electrons from the cathode electrode 140 are combined with each other in the light emitting layer 130 to emit light. In this case, the area where the bank 125 is not formed and the anode electrode 120 is exposed may be an emission area EA, and the other area may be a non-emission area NEA.

The bank 125 may be formed of an organic layer, for example, acryl resin, epoxy resin, phenolic resin, polyamide resin, polyimide resin, etc.

The organic light emitting layer 130 may be provided over the anode electrode 120. The organic light emitting layer 130 may include a hole transporting layer, a light emitting layer, and an electron transporting layer. In this case, if a voltage is applied to the anode electrode 120 and the cathode electrode 140, holes and electrons move to the light emitting layer through the hole transporting layer and the electron transporting layer, respectively, and are combined with each other in the light emitting layer to emit light.

The organic light emitting layer 130, as shown in FIG. 4, may include light emitting layers each of which is formed for each of the subpixels P1, P2, and P3. For example, a green light emitting layer 131 emitting green light may be formed in the first subpixel P1, a red light emitting layer 132 emitting red light may be formed in the second subpixel P2, and a blue light emitting layer 133 emitting blue light may be formed in the third subpixel P3. In this case, the light emitting layers of the organic light emitting layer 130 are not formed in the transmissive area TA.

The cathode electrode 140 may be provided over the organic light emitting layer 130 and the bank 125. The cathode electrode 140 may be provided in the transmissive area TA as well as the non-transmissive area NTA that includes the emission area EA, but is not limited thereto. The cathode electrode 140 may be provided in only the non-transmissive area NTA that includes the emission area EA, and may not be provided in the transmissive area TA to improve transmittance.

The cathode electrode 140 may be a common layer commonly formed for the subpixels P1, P2, and P3 to apply the same voltage to the subpixels P1, P2, and P3. The cathode electrode 140 may be formed of a transparent conductive material (TCO) such as ITO and IZO, which can transmit light, or may be formed of a semi-transmissive conductive material such as Mg, Ag, or alloy of Mg and Ag. If the cathode electrode 140 is formed of a semi-transmissive conductive material, emission efficiency may be enhanced by micro cavity.

An encapsulation layer 150 may be provided over the light emitting diodes. The encapsulation layer 150 may be formed over the cathode electrode 140 to overlay the cathode electrode 140. The encapsulation layer 150 serves to prevent oxygen or water from being permeated into the organic light emitting layer 130 and the cathode electrode 140. Accordingly, in some embodiments, the encapsulation layer 150 may include at least one inorganic film and at least one organic film.

Meanwhile, although not shown in FIG. 4, a capping layer may additionally be formed between the cathode electrode 140 and the encapsulation layer 150.

A color filter layer 170 may be provided over the encapsulation layer 150. The color filter layer 170 may be provided over one surface of the second substrate 112 that faces the first substrate 111. In this case, the first substrate 111 provided with the encapsulation layer 150 and the second substrate 112 provided with the color filter layer 170 may be bonded to each other by an adhesive layer 160. In some embodiments, the adhesive layer 160 may be an optically clear resin (OCR) layer or an optically clear adhesive (OCA) film.

The color filter layer 170 may be formed to be patterned for each of the subpixels P1, P2 and P3. In detail, the color filter layer 170 may include a first color filter CF1, a second color filter CF2, and a third color filter CF3. The first color filter CF1 may be disposed to correspond to the emission area EA1 of the first subpixel P1, and may be a green color filter that transmits green light. The second color filter CF2 may be disposed to correspond to the emission area EA2 of the second subpixel P2, and may be a red color filter that transmits red light. The third color filter CF3 may be disposed to correspond to the emission area EA3 of the third subpixel P3, and may be a blue color filter that transmits blue light.

The transparent display panel 110 according to one embodiment of the present disclosure is characterized in that a polarizer is not used, and the color filter layer 170 is formed in the second substrate 112. If the polarizer is attached to the transparent display panel 110, transmittance of the transparent display panel 110 is reduced by the polarizer. Meanwhile, if the polarizer is not attached to the transparent display panel 110, a problem occurs in that externally incident light is reflected towards the electrodes.

Since a polarizer is not attached to the transparent display panel 110 according to one embodiment of the present disclosure, transmittance may be prevented from being reduced. Also, in the transparent display panel 110 according to one embodiment of the present disclosure, the color filter layer 170 may be formed in the second substrate 112 to partially absorb externally incident light, thereby preventing the incident light from being reflected toward the electrodes. That is, the transparent display panel 110 according to one embodiment of the present disclosure may reduce external light reflectivity without reducing transmittance.

Meanwhile, a black matrix BM may be provided among the color filters CF1, CF2 and CF3. The black matrix BM may be provided among the subpixels P1, P2, and P3 to prevent color mixture among the adjacent subpixels P1, P2, and P3 from occurring. Also, the black matrix BM may prevent externally incident light from being reflected toward a plurality of lines provided among the subpixels P1, P2, and P3, for example, the gate lines, the data lines, the pixel power lines, the common power lines, the reference lines, etc.

The black matrix BM may include a material that absorbs light, for example, a black dye that absorbs light of a visible light wavelength range.

Referring to FIG. 2 again, the non-display area NDA may be provided with a pad area PA in which pads PAD are disposed, and at least one gate driver 205.

In detail, the non-display area NDA may include a first non-display area NDA1 in which the pads PAD are disposed, a second non-display area NDA2 disposed in parallel with the first non-display area NDA1 by interposing the display area DA, and third and fourth non-display areas NDA3 and NDA4 connecting the first non-display area NDA1 with the second non-display area NDA2.

The gate driver 205 is connected to the gate lines GL and supplies gate signals to the gate lines GL. The gate driver 205 may be disposed in at least one of the fourth non-display area NDA4 and the third non-display area NDA3 in a gate drive in panel (GIP) type. For example, as shown in FIG. 2, the gate driver 205 may be formed in the fourth non-display area NDA4, and another gate driver 205 may be formed in the third non-display area NDA3, but is not limited thereto. The gate driver 205 may be formed in any one of the fourth non-display area NDA4 and the third non-display area NDA3.

The pads PAD may include a first pad VDDP, a second pad VSSP, a third pad VREFP, and a fourth pad DP, and may be provided in the first non-display area NDA1. That is, the first non-display area NDA1 may include a pad area PA.

The transparent display panel 110 according to one embodiment of the present disclosure may include a plurality of signal lines connected with the subpixels P1, P2 and P3 provided in the display area DA. For example, the transparent display panel 110 according to one embodiment of the present disclosure may include a pixel power line VDD, a common power line VSS and a reference line VREF.

The pixel power line VDD may supply a first power source to the driving transistor T of each of the subpixels P1, P2 and P3 provided in the display area DA.

Accordingly, in some embodiments, the pixel power line VDD may include a first pixel power line VDD1 provided in a first non-display area NDA1, a second pixel power line VDD2 provided in a second non-display area NDA2, and a plurality of third pixel power lines VDDL connecting the first pixel power line VDD1 with the second pixel power line VDD2.

The common power line VSS may supply a second power source to the cathode electrode 140 of the subpixels P1, P2, and P3 provided in the display area DA. In some embodiments, the second power source may be a common power source commonly supplied to the subpixels P1, P2, and P3.

Accordingly, in some embodiments, the common power line VSS may include a first common power line VSS1 provided in the first non-display area NDA1, a second common power line VSS2 provided in the second non-display area NDA2, and a plurality of third common power lines VSSL connecting the first common power line VSS1 with the second common power line VSS2.

The reference line VREF may supply an initialization voltage (or sensing voltage) to the driving transistor T of each of the subpixels P1, P2, and P3 provided in the display area DA.

Accordingly, in some embodiments, the reference line VREF may include a first reference line VREF1 provided in the first non-display area NDA1, and a plurality of second reference lines VREFL disposed in the display area DA.

Hereinafter, the first pixel power line VDD1, the first common power line VSS1 and the first reference line VREF1, which are provided in a first non-display area NDA1, will be described in more detail with reference to FIGS. 5 to 8.

Figure 5:
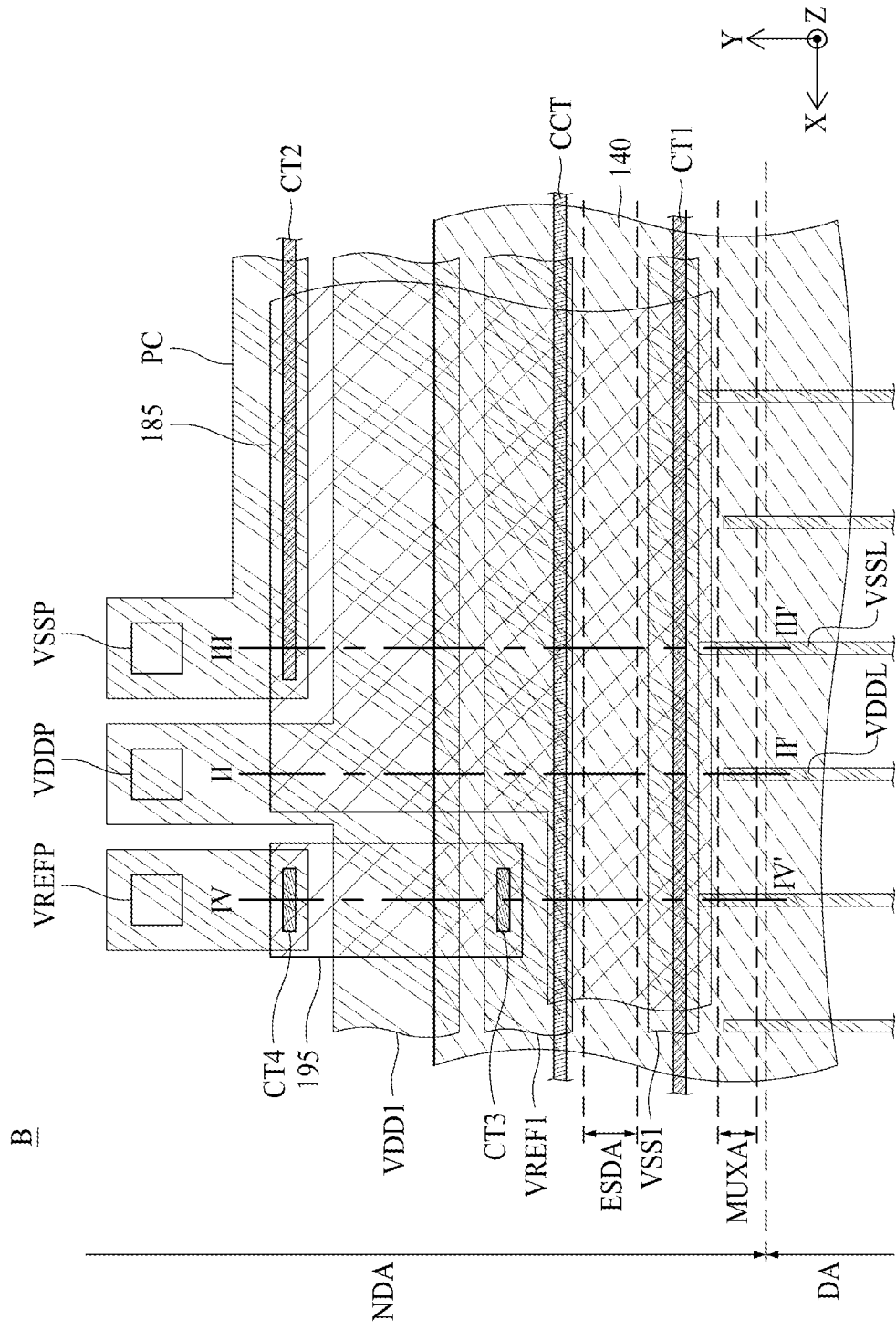
FIG. 5 is an enlarged view of an area B in FIG. 2.
Figure 6:
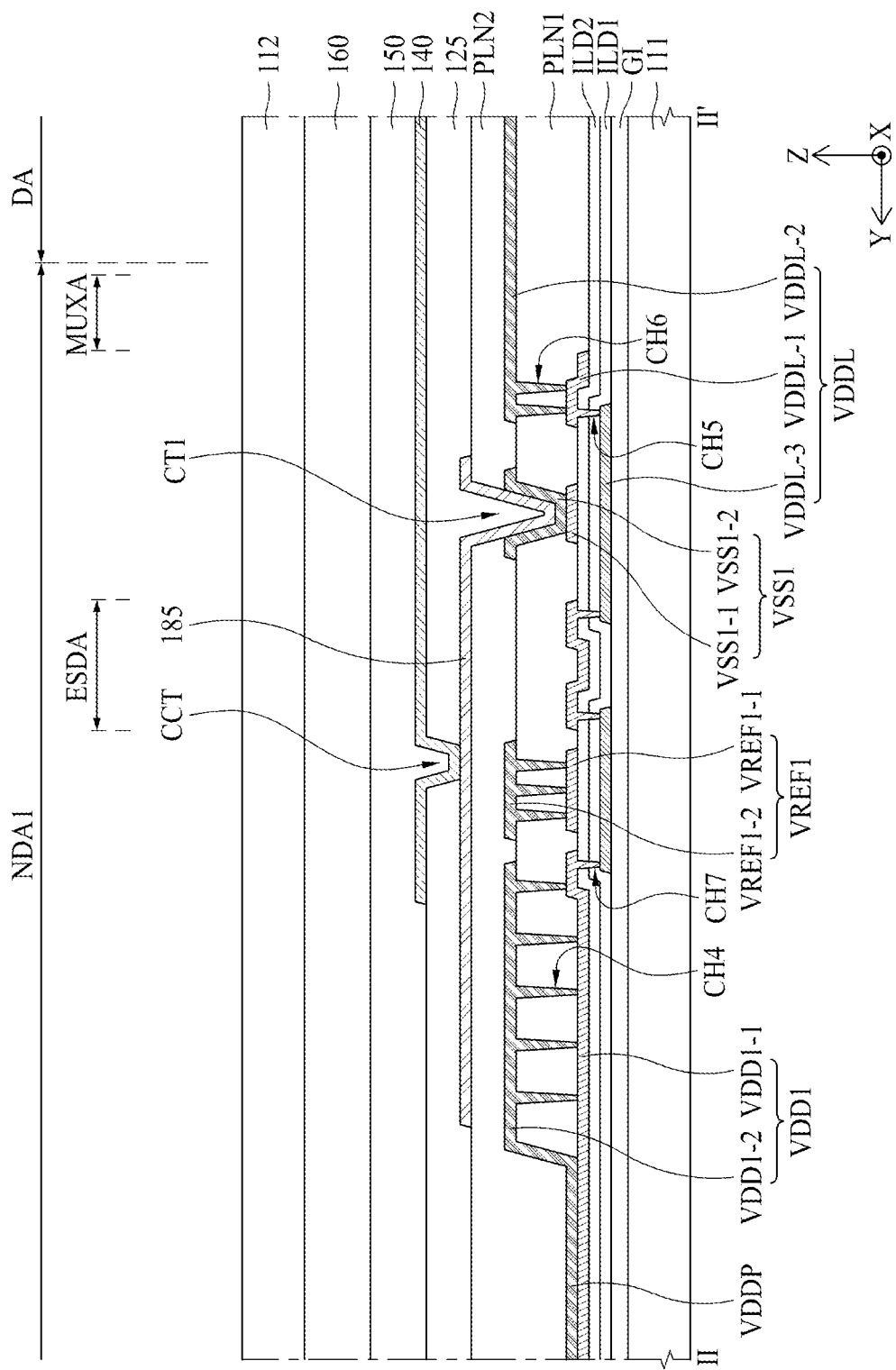
FIG. 6 is a cross-sectional view taken along line II-II' of FIG. 5.
Figure 7:
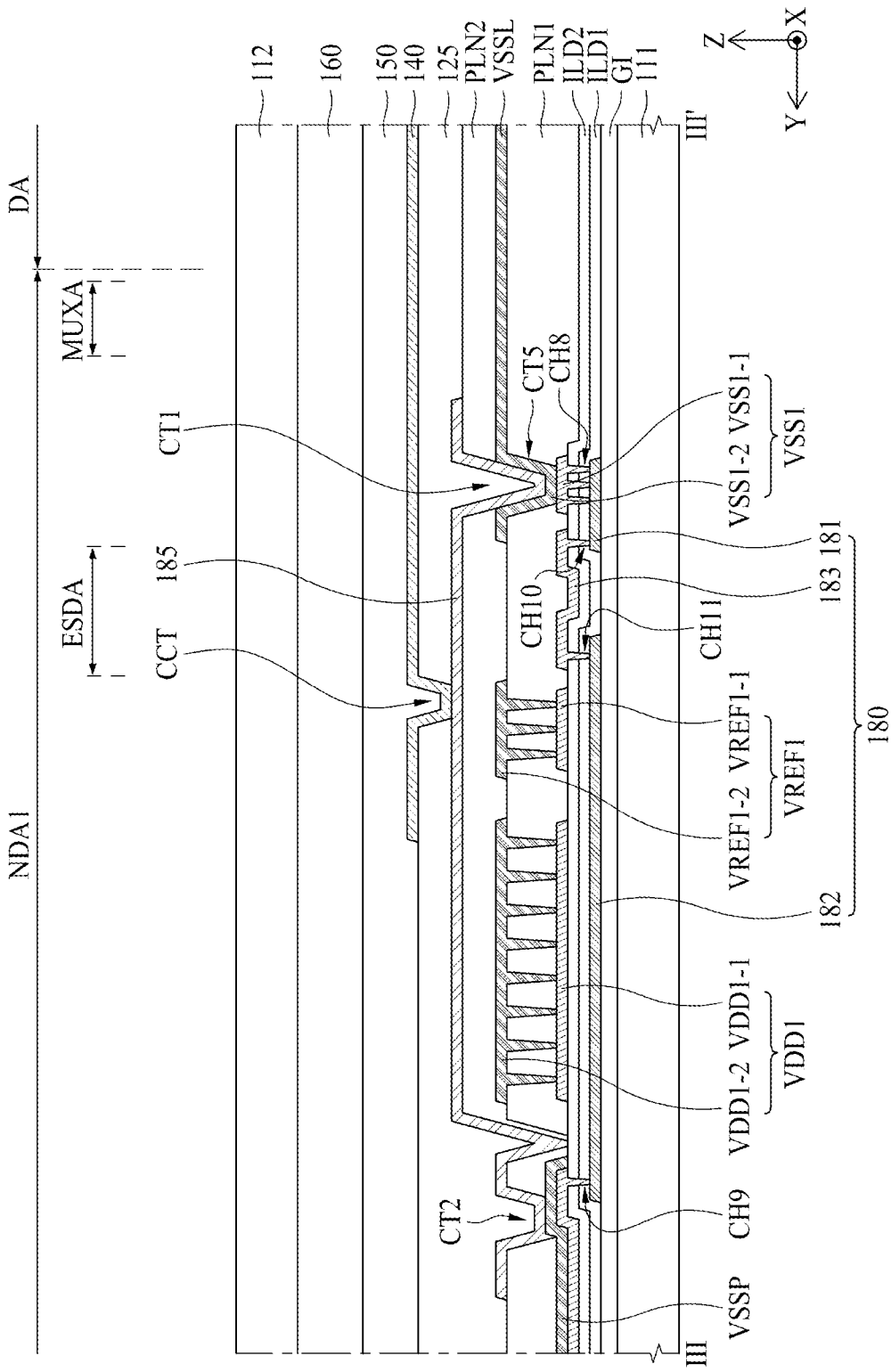
FIG. 7 is a cross-sectional view taken along line III-III' of FIG. 5.
Figure 8:
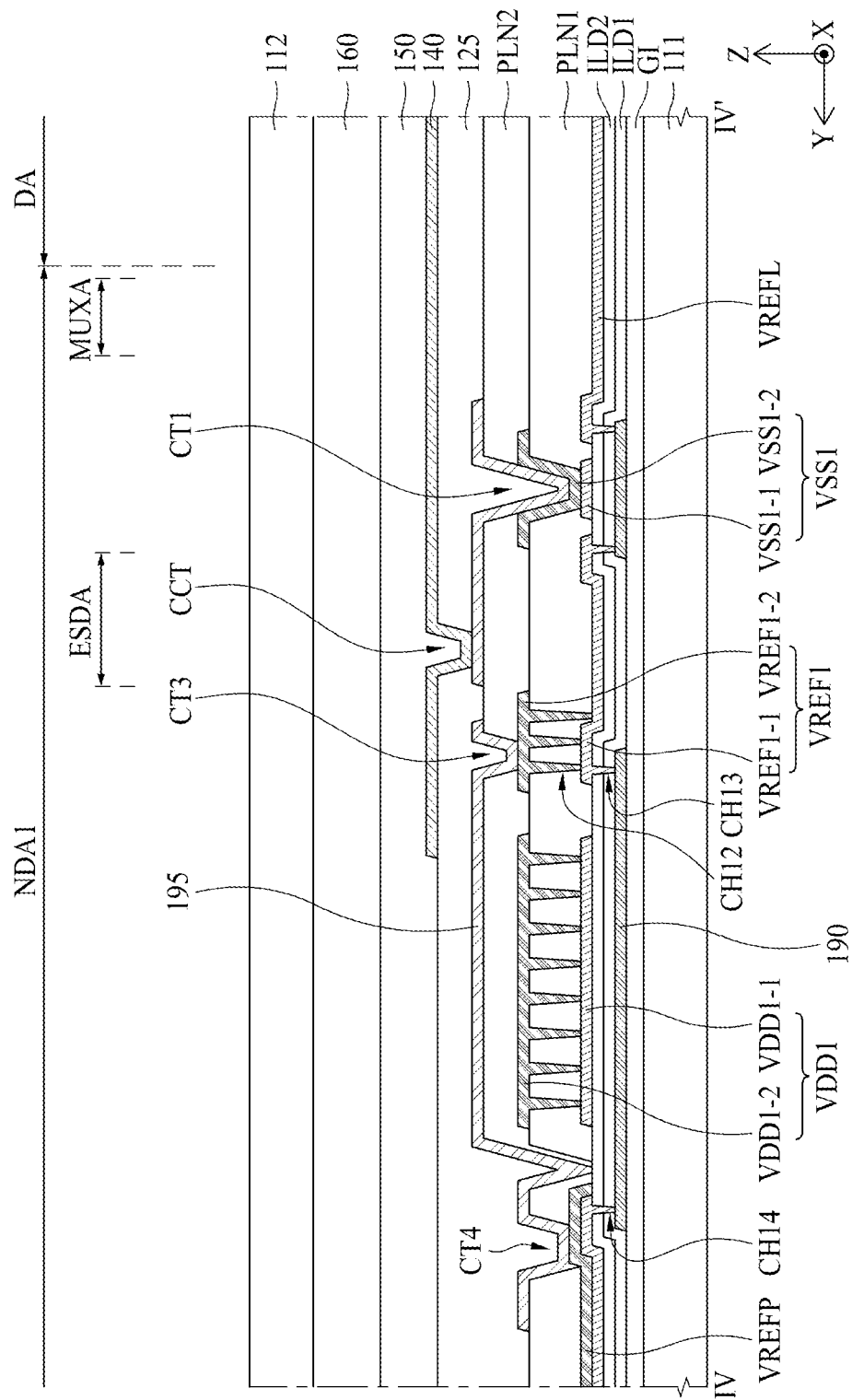
FIG. 8 is a cross-sectional view taken along line IV-IV' of FIG. 5.

FIG. 5 is an enlarged view of an area B in FIG. 2, FIG. 6 is a cross-sectional view taken along line II-II' of FIG. 5, FIG. 7 is a cross-sectional view taken along line III-III' of FIG. 5, and FIG. 8 is a cross-sectional view taken along line IV-IV' of FIG. 5.

The pads PAD, a first pixel power line VDD1, a first common power line VSS1, a first reference line VREF1, a third pixel power line VDDL and a third common power line VSSL are provided in the first non-display area NDA1.

Referring to FIGS. 2, 5 and 6, the first pixel power line VDD1 may be provided to be extended in the first non-display area NDA1, specifically between the pad area PA and the display area DA in a first direction (e.g., X axis direction). The first pixel power line VDD1 may be connected with the first pad VDDP in the first non-display area NDA1, and may be supplied with a first power source from the first pad VDDP. The first pad VDDP may be extended in a second direction (e.g., Y axis direction), and may be connected with the first pixel power line VDD1. For example, the first pixel power line VDD1 and the first pad VDDP may be provided in the same layer as shown in FIG. 6, and may be connected with each other without being spaced apart from each other.

Also, the first pixel power line VDD1 may be connected with a plurality of third pixel power lines VDDL disposed in the display area DA, and may supply the first power source to the driving transistor T of each of the subpixels P1, P2 and P3 through the plurality of third pixel power lines VDDL.

The first pixel power line VDD1 may be made of a plurality of metal layers. For example, the first pixel power line VDD1, as shown in FIG. 6, may include a first metal layer VDD1-1 and a second metal layer VDD1-2 provided over the first metal layer VDD1-1. The first metal layer VDD1-1 and the second metal layer VDD1-2 may partially be overlapped with each other, and may be connected with each other through a fourth contact hole CH4.

In some embodiments, the first metal layer VDD1-1 of the first pixel power line VDD1 may be provided in the same layer as the source electrode SE and the drain electrode DE of the driving transistor T provided in the display area DA. The first metal layer VDD1-1 may be made of the same material as that of the source electrode SE and the drain electrode DE of the driving transistor T and may be simultaneously formed with them.

The second metal layer VDD1-2 of the first pixel power line VDD1 may be provided in the same layer as the anode auxiliary electrode 115 provided in the display area DA. The second metal layer VDD1-2 may be made of the same material as that of the anode auxiliary electrode 115 and may be formed simultaneously with the anode auxiliary electrode 115. In this case, the second metal layer VDD1-2 of the first pixel power line VDD1 may be connected to the first metal layer VDD1-1 through a plurality of fourth contact holes CH4 that pass through the first planarization layer PLN1.

In the transparent display panel 110 according to one embodiment of the present disclosure, as the first pixel power line VDD1 provided in the non-display area NDA is provided as a double layer, a total area of the first pixel power line VDD1 may be increased, whereby resistance of the first pixel power line VDD1 may be reduced.

Also, in the transparent display panel 110 according to one embodiment of the present disclosure, as the second metal layer VDD1-2 of the first pixel power line VDD1 may be connected to the first metal layer VDD1-1 through the plurality of fourth contact holes CH4, the first metal layer VDD1-1 and the second metal layer VDD1-2 may stably be connected with each other.

Meanwhile, in the transparent display panel 110 according to one embodiment of the present disclosure, the first metal layer VDD1-1 and the second metal layer VDD1-2 of the first pixel power line VDD1 are not in entire contact with each other. If the first metal layer VDD1-1 and the second metal layer VDD1-2 of the first pixel power line VDD1 are in entire contact with each other, even though the second planarization layer PLN2 is deposited over the second metal layer VDD1-2, an upper surface of the area where the first metal layer VDD1-1 and the second metal layer VDD1-2 are in contact with each other may be formed to be recessed toward the first substrate 111 without being planarized. For this reason, a problem may occur in that the layers formed over the first metal layer VDD1-1 and the second metal layer VDD1-2 of the first pixel power line VDD1, for example, a second common power connection electrode 185, the cathode electrode 140, the encapsulation layer 150 are not deposited stably.

In the transparent display panel 110 according to one embodiment of the present disclosure, the first metal layer VDD1-1 and the second metal layer VDD1-2 of the first pixel power line VDD1 may be in contact with each other through the plurality of fourth contact holes CH4 without entire contact. In the transparent display panel 110 according to one embodiment of the present disclosure, if the second planarization layer PLN2 is formed over the second metal layer VDD1-2, a planarized upper surface may be provided even in the area where the first metal layer VDD1-1 and the second metal layer VDD1-2 are in contact with each other. Therefore, in the transparent display panel 110 according to one embodiment of the present disclosure, the layers formed over the first metal layer VDD1-1 and the second metal layer VDD1-2 of the first pixel power line VDD1, for example, the second common power connection electrode 185, the cathode electrode 140, the encapsulation layer 150 may be deposited stably.

The third pixel power line VDDL may be provided between the transmissive areas TA in the display area DA, and thus may be connected with the driving transistor T of each of the subpixels P1, P2 and P3. The third pixel power line VDDL may be extended in the display area DA in a second direction (e.g., Y axis direction), and thus its one end may be connected with the first pixel power line VDD1.

In some embodiments, the third pixel power line VDDL may be connected with the first pixel power line VDD1 as one layer but may be connected with the first pixel power line VDD1 as a plurality of layers as shown in FIG. 6.

For example, the third pixel power line VDDL may include a second metal layer VDDL-2 and a third metal layer VDDL-3 provided below the second metal layer VDDL-2. The second metal layer VDDL-2 of the third pixel power line VDDL may be extended in the display area DA to the first non-display area NDA1 in a second direction (e.g., Y axis direction). The second metal layer VDDL-2 may be provided in the same layer as the anode auxiliary electrode 115 provided in the display area DA. The second metal layer VDDL-2 may be made of the same material as that of the anode auxiliary electrode 115 and may be formed simultaneously with the anode auxiliary electrode 115.

One end of the third metal layer VDDL-3 of the third pixel power line VDDL may be connected to the second metal layer VDDL-2 of the third pixel power line VDDL in the first non-display area NDA1, and the other end thereof may be connected to the first pixel power line VDD1. The third metal layer VDDL-3 may be provided in the same layer as the gate electrode GE of the driving transistor T provided in the display area DA. The third metal layer VDDL-3 may be made of the same material as that of the gate electrode GE of the driving transistor T and may be formed simultaneously with the gate electrode GE.

The third metal layer VDDL-3 of the third pixel power line VDDL may be connected to the second metal layer VDDL-2 of the third pixel power line VDDL at one end through the first metal layer VDDL-1. In this case, the third metal layer VDDL-3 of the third pixel power line VDDL may be connected to the first metal layer VDDL-1 through a fifth contact hole CH5 that passes through the first and second inter-layer insulating layers ILD1 and ILD2. The first metal layer VDDL-1 may be connected to the second metal layer VDDL-2 of the third pixel power line VDDL through a sixth contact hole CH6 that passes through the first planarization layer PLN1. Therefore, the third metal layer VDDL-3 of the third pixel power line VDDL may electrically be connected with the second metal layer VDDL-2 of the third pixel power line VDDL.

Also, the third metal layer VDDL-3 of the third pixel power line VDDL may be connected to the first metal layer VDD1-1 of the first pixel power line VDD1 at the other end through a seventh contact hole CH7 that passes through the first and second inter-layer insulating layers ILD1 and ILD2.

Meanwhile, the third metal layer VDDL-3 of the third pixel power line VDDL may be formed as one line pattern but is not limited thereto. The third metal layer VDDL-3 of the third pixel power line VDDL may include a plurality of line patterns. In this case, the third metal layer VDDL-3 of the third pixel power line VDDL may electrically be connected with the plurality of line patterns through the metal layer provided over another layer, for example, the first metal layer VDDL-1.

Referring to FIGS. 2, 5 and 7, the first common power line VSS1 may be provided to be extended in the first non-display area NDA1, specifically between the first pixel power line VDD1 and the display area DA in a first direction (e.g., X axis direction). The first common power line VSS1 may be connected with the second pad VSSP in the first non-display area NDA1, and may be supplied with a second power source from the second pad VSSP. Also, the first common power line VSS1 may be connected with the plurality of third common power lines VSSL disposed in the display area DA, and may supply the second power source to the cathode electrode 140 of the subpixels P1, P2 and P3 through the plurality of third common power lines VSSL.

The first common power line VSS1 may be made of a plurality of metal layers. For example, the first common power line VSS1, as shown in FIG. 7, may include a first metal layer VSS1-1 and a second metal layer VSS1-2 provided over the first metal layer VSS1-1. The first metal layer VSS1-1 and the second metal layer VSS1-2 may partially be overlapped with each other, and may be connected with each other through a fifth contact part CT5.

In some embodiments, the first metal layer VSS1-1 of the first common power line VSS1 may be provided in the same layer as the source electrode SE and the drain electrode DE of the driving transistor T provided in the display area DA. The first metal layer VSS1-1 may be made of the same material as that of the source electrode SE and the drain electrode DE of the driving transistor T and may be formed simultaneously with them.

The second metal layer VSS1-2 of the first common power line VSS1 may be provided in the same layer as the anode auxiliary electrode 115 provided in the display area DA. The second metal layer VSS1-2 may be made of the same material as that of the anode auxiliary electrode 115 and may be formed simultaneously with the anode auxiliary electrode 115.

In this case, the second metal layer VSS1-2 of the first common power line VSS1 may be connected to the first metal layer VSS1-1 through the fifth contact part CT5 that passes through the first planarization layer PLN1. The fifth contact part CT5 may partially remove the first planarization layer PLN1 and partially expose the upper surface of the first metal layer VSS1-1 of the first common power line VSS1. In some embodiments, the fifth contact part CT5 may expose the upper surface of the first metal layer VSS1-1 of the first common power line VSS1 along the first direction (e.g., X axis direction). The second metal layer VSS1-2 of the first common power line VSS1 may directly in contact with the exposed upper surface of the first metal layer VSS1-1 of the first common power line VSS1. As a result, the second metal layer VSS1-2 of the first common power line VSS1 may have a wide contact area with the first metal layer VSS1-1 of the first common power line VSS1, thereby being stably connected to the first metal layer VSS1-1.

In the transparent display panel 110 according to one embodiment of the present disclosure, as the first common power line VSS1 provided in the non-display area NDA is provided as a double layer, a total area of the first common power line VSS1 may be increased, whereby resistance of the first common power line VSS1 may be reduced.

Meanwhile, the first common power line VSS1 may electrically be connected with the second pad VSSP provided in the pad area PA. In some embodiments, the first pixel power line VDD1 and the first reference line VREF1 may be provided between the first common power line VSS1 and the second pad VSSP. If the first common power line VSS1 is formed in the same layer as the first pixel power line VDD1 and the first reference line VREF1, the first common power line VSS1 and the second pad VSSP cannot be formed in the same layer in a single body.

The transparent display panel 110 according to one embodiment of the present disclosure may electrically connect the first common power line VSS1 with the second pad VSSP by using a plurality of connection electrodes disposed on different layers.

In detail, the transparent display panel 110 according to one embodiment of the present disclosure may electrically connect the first common power line VSS1 with the second pad VSSP by using a first common power connection electrode 180 and a second common power connection electrode 185, which are disposed on their respective layers different from each other.

The first common power connection electrode 180 is provided in the first non-display area NDA1. The first common power connection electrode 180 is provided between the first common power line VSS1 and the first substrate 111, and electrically connects the first common power line VSS1 with the second pad VSSP.

For example, the first common power connection electrode 180 may be provided in the same layer as the gate electrode GE of the driving transistor T provided in the display area DA. Also, the first common power connection electrode 180 may be made of the same material as that of the gate electrode GE of the driving transistor T and may be formed simultaneously with the gate electrode GE.

One end of the first common power connection electrode 180 may be connected to the first common power line VSS1 and the other end of the first common power connection electrode 180 may be connected to the second pad VSSP. In detail, the first common power connection electrode 180 may be connected to the first metal layer VSS1-1 of the first common power line VSS1 at one end through an eighth contact hole CH8 that passes through the first and second inter-layer insulating layers ILD1 and ILD2. Also, the first common power connection electrode 180 may be connected to the second pad VSSP at the other end through a ninth contact hole CH9 that passes through the first and second inter-layer insulating layers ILD1 and ILD2.

Meanwhile, the first common power connection electrode 180 may be formed between the second pad VSSP and the first common power line VSS1 as one electrode but is not limited thereto. The first common power connection electrode 180 may include a plurality of electrodes.

For example, the first common power connection electrode 180, as shown in FIG. 7, may include one first common power connection electrode 181, another first common power connection electrode 182, and other first common power connection electrode 183.

One first common power connection electrode 181 may be connected to the first common power line VSS1 through the eighth contact hole CH8, and another first common power connection electrode 182 may be connected to the second pad VSSP through the ninth contact hole CH9. One first common power connection electrode 181 and another first common power connection electrode 182 may be provided in the same layer as the gate electrode GE of the driving transistor T.

One end of the other first common power connection electrode 183 provided over a layer different from one first common power connection electrode 181 and another first common power connection electrode 182 may be connected to the first common power connection electrode 181 through a tenth contact hole CH10, and the other end thereof may be connected to the first common power connection electrode 182 through an eleventh contact hole CH11. In some embodiments, the other first common power connection electrode 183 may be provided in the same layer as the source electrode SE and the drain electrode DE of the driving transistor T.

The second common power connection electrode 185 may be provided in the first non-display area NDA1, and may partially be overlapped with the first common power connection electrode 180. Also, the second common power connection electrode 185 is provided over the first common power line VSS1, and electrically connects the first common power line VSS1 with the second pad VSSP.

For example, the second common power connection electrode 185 may be provided in the same layer as the anode electrode 120 of the light emitting diode provided in the display area DA. Also, the second common power connection electrode 185 may be made of the same material as that of the anode electrode 120 of the light emitting diode and may be formed simultaneously with the anode electrode 120.

One end of the second common power connection electrode 185 may be connected to the first common power line VSS1, and the other end of the second common power connection electrode 185 may be connected to the second pad VSSP. In detail, the second common power connection electrode 185 may be connected to the second metal layer VSS1-2 of the first common power line VSS1 at one end through a first contact part CT1. The first contact part CT1 may partially remove the second planarization layer PLN2 and partially expose the upper surface of the second metal layer VSS1-2 of the first common power line VSS1. In some embodiments, the first contact part CT1 may expose the upper surface of the second metal layer VSS1-2 of the first common power line VSS1 along the first direction (e.g., X axis direction). The second common power connection electrode 185 may directly in contact with the exposed upper surface of the first common power line VSS1. As a result, the second common power connection electrode 185 may have a wide contact area with the first common power line VSS1, thereby being stably connected to the first common power line VSS1. Meanwhile, at least a part of the first contact part CT1 may be formed to overlap the fifth contact part CT5.

The second common power connection electrode 185 may be connected to the second pad VSSP at the other end through a second contact part CT2. The second contact part CT2 may partially remove the first planarization layer PLN1 and partially expose the upper surface of the second pad VSSP. The second pad VSSP, as shown in FIG. 2, may include a plurality of pad parts. In some embodiments, two pad parts disposed to adjoin each other may be connected with each other through a pad connection electrode PC. The second contact part CT2 may expose the upper surface of the second pad VSSP connected by the pad connection electrode PC along the first direction (e.g., X axis direction). The second common power connection electrode 185 may directly in contact with the exposed upper surface of the second pad VSSP. As a result, the second common power connection electrode 185 may have a wide contact area with the second pad VSSP, thereby being stably connected to the second pad VSSP.

Also, the second common power connection electrode 185 may electrically be connected with the cathode electrode 140 through a cathode contact part CCT in the first non-display area NDA1. The cathode contact part CCT may partially remove the bank 125 and partially expose the upper surface of the second common power connection electrode 185. The cathode contact part CCT may expose the upper surface of the second common power connection electrode 185 along the first direction (e.g., X axis direction). As a result, the second common power connection electrode 185 may have a wide contact area with the cathode electrode 140, thereby being stably connected to the cathode electrode 140.

Consequently, the first common power line VSS1 may electrically be connected with the cathode electrode 140 through the second common power connection electrode 185. Therefore, the first common power line VSS1 may supply the second power source forwarded from the second pad VSSP to the cathode electrode 140.

The transparent display panel 110 according to one embodiment of the present disclosure may electrically connect the first common power line VSS1 and the second pad VSSP, which are disposed in the first non-display area NDA1, with each other by using the first common power connection electrode 180 and the second common power connection electrode 185 disposed on their respective layers different from each other. In some embodiments, the first common power connection electrode may be provided below the first common power line VSS1 and the second pad VSSP, and the second common power connection electrode may be provided over the first common power line VSS1 and the second pad VSSP.

Therefore, the transparent display panel 110 according to one embodiment of the present disclosure may increase a total area of the common power line VSS, whereby resistance of the common power line VSS may be reduced.

Also, in the transparent display panel 110 according to one embodiment of the present disclosure, even though a defect occurs in any one of the first common power connection electrode 180 and the second common power connection electrode 185, the first common power line VSS1 and the second pad VSSP may be connected with each other by the other one. Therefore, since the transparent display panel 110 according to one embodiment of the present disclosure may stably supply the first power source to the subpixels P1, P2 and P3, panel yield may be improved.

The third common power line VSSL is provided between the transmissive areas TA in the display area DA. In some embodiments, the transparent display panel 110 according to one embodiment of the present disclosure may reduce or minimize the non-transmissive area NTA in the display area DA by alternately disposing the third common power line VSSL and the third pixel power line VDDL between the transmissive areas TA. Therefore, the transparent display panel 110 according to one embodiment of the present disclosure may enhance transmittance by increasing the transmissive area TA.

Meanwhile, the third common power line VSSL may be extended in the display area DA in a second direction (e.g., Y axis direction), and thus its one end may be connected with the first common power line VSS1 and its other end may be connected with the second common power line VSS2. For example, the third common power line VSSL and the first common power line VSS1, as shown in FIG. 7, may be provided in the same layer, and may be connected with each other without being spaced apart from each other.

Referring to FIGS. 2, 5 and 8, the first reference line VREF1 may be provided to be extended in the first non-display area NDA1, specifically between the first pixel power line VDD1 and the first common power line VSS1 in a first direction (e.g., X axis direction). The first reference line VREF1 may be connected with the third pad VREFP in the first non-display area NDA1, and may be supplied with the initialization voltage (or sensing voltage) from the third pad VREFP. Also, the first reference line VREF1 may be connected with the plurality of second reference lines VREFL disposed in the display area DA, and may supply the initialization voltage (or sensing voltage) to the transistor T of each of the subpixels P1, P2 and P3 through the plurality of second reference lines VREFL.

The first reference line VREF1 may be made of a plurality of metal layers. For example, the first reference line VREF1, as shown in FIG. 8, may include a first metal layer VREF1-1 and a second metal layer VREF1-2 provided over the first metal layer VREF1-1. The first metal layer VREF1-1 and the second metal layer VREF1-2 may partially be overlapped with each other, and may be connected with each other through a twelfth contact hole CH12.

In some embodiments, the first metal layer VREF1-1 of the first reference line VREF1 may be provided in the same layer as the source electrode SE and the drain electrode DE of the driving transistor T provided in the display area DA. The first metal layer VREF1-1 may be made of the same material as that of the source electrode SE and the drain electrode DE of the driving transistor T and may be formed simultaneously with them.

The second metal layer VREF1-2 of the first reference line VREF1 may be provided in the same layer as the anode auxiliary electrode 115 provided in the display area DA. The second metal layer VREF1-2 may be made of the same material as the anode auxiliary electrode 115 and may be formed simultaneously with the anode auxiliary electrode 115. In this case, the second metal layer VREF1-2 of the first reference line VREF1 may be connected to the first metal layer VREF1-1 through the twelfth contact hole CH12 that passes through the first planarization layer PLN1.

In the transparent display panel 110 according to one embodiment of the present disclosure, as the first reference line VREF1 provided in the non-display area NDA is provided as a double layer, a total area of the first reference line VREF1 may be increased, whereby resistance of the first reference line VREF1 may be reduced.

Meanwhile, the first reference line VREF1 may electrically be connected with the third pad VREFP provided in the pad area PA. In some embodiments, the first pixel power line VDD1 may be provided between the first reference line VREF1 and the third pad VREFP. If the first reference line VREF1 is formed in the same layer as the first pixel power line VDD1, the first reference line VREF1 and the third pad VREFP cannot be formed in the same layer in a single body.

The transparent display panel 110 according to one embodiment of the present disclosure may electrically connect the first reference line VREF1 with the third pad VREFP by using a plurality of connection electrodes disposed over different layers.

In detail, the transparent display panel 110 according to one embodiment of the present disclosure may electrically connect the first reference line VREF1 with the third pad VREFP by using a first reference connection electrode 190 and a second reference connection electrode 195, which are disposed on their respective layers different from each other.

The first reference connection electrode 190 is provided in the first non-display area NDA1. The first reference connection electrode 190 is provided between the first reference line VREF1 and the first substrate 111, and electrically connects the first reference line VREF1 with the third pad VREFP.

For example, the first reference connection electrode 190 may be provided in the same layer as the gate electrode GE of the driving transistor T provided in the display area DA. Also, the first reference connection electrode 190 may be made of the same material as that of the gate electrode GE of the driving transistor T and may be formed simultaneously with the gate electrode GE.

One end of the first reference connection electrode 190 may be connected to the first reference line VREF1 and the other end of the first reference connection electrode 190 may be connected to the third pad VREFP. In detail, the first reference connection electrode 190 may be connected to the first metal layer VREF1-1 of the first reference line VREF1 at one end through a thirteenth contact hole CH13 that passes through the first and second inter-layer insulating layers ILD1 and ILD2. Also, the first reference connection electrode 190 may be connected to the third pad VREFP at the other end through a fourteenth contact hole CH14 that passes through the first and second inter-layer insulating layers ILD1 and ILD2.

Meanwhile, the first reference connection electrode 190 may be formed between the first reference line VREF1 and the third pad VREFP as one electrode but is not limited thereto. The first reference connection electrode 190 may include a plurality of electrodes.

The second reference connection electrode 195 may be provided in the first non-display area NDA1. At least a part of the second reference connection electrode 195 may be overlapped with the first reference connection electrode 190. The second reference connection electrode 195 is provided over the first reference line VREF1, and electrically connects the first reference line VREF1 with the third pad VREFP.

For example, the second reference connection electrode 195 may be provided in the same layer as the anode electrode 120 of the light emitting diode provided in the display area DA. Also, the second reference connection electrode 195 may be made of the same material as that of the anode electrode 120 of the light emitting diode and may be formed simultaneously with the anode electrode 120.

One end of the second reference connection electrode 195 may be connected to the first reference line VREF1 and the other end thereof may be connected to the third pad VREFP. In detail, the second reference connection electrode 195 may be connected to the second metal layer VREF1-2 of the first reference line VREF1 at one end through a third contact part CT3. The third contact part CT3 may partially remove the second planarization layer PLN2 and partially expose the upper surface of the second metal layer VREF1-2 of the first reference line VREF1. In some embodiments, the third contact part CT3 may expose the upper surface of the second metal layer VREF1-2 of the first reference line VREF1 along the first direction (e.g., X axis direction). As a result, the second reference connection electrode 195 may have a wide contact area with the first reference line VREF1, thereby being stably connected to the first reference line VREF1.

The second reference connection electrode 195 may be connected to the third pad VREFP at the other end through a fourth contact part CT4. The fourth contact part CT4 may partially remove the first planarization layer PLN1 and partially expose the upper surface of the third pad VREFP. In some embodiments, the fourth contact portion CT4 may expose the upper surface of the third pad VREFP along the first direction (e.g., X axis direction). The second reference connection electrode 195 may directly in contact with the exposed upper surface of the third pad VREFP. As a result, the second reference connection electrode 195 may have a wide contact area with the third pad VREFP, thereby being stably connected to the third pad VREFP.

The second reference connection electrode 195 is formed in the same layer as the second common power connection electrode 185 but is spaced apart from the second common power connection electrode 185. Therefore, the second reference connection electrode 195 is not electrically connected with the second common power connection electrode 185.

The transparent display panel 110 according to one embodiment of the present disclosure may connect the first reference line VREF1 and the third pad VREFP, which are disposed in the first non-display area NDA1, with each other by using the first reference connection electrode 190 and the second reference connection electrode 195 disposed on their respective layers different from each other. In some embodiments, the first reference connection electrode 190 may be provided below the first reference line VREF1 and the third pad VREFP, and the second reference connection electrode 195 may be provided over the first reference line VREF1 and the third pad VREFP.

Therefore, the transparent display panel 110 according to one embodiment of the present disclosure may increase a total area of the first reference line VREF1, whereby resistance of the first reference line VREF1 may be reduced.

Also, in the transparent display panel 110 according to one embodiment of the present disclosure, even though a defect occurs in any one of the first reference connection electrode 190 and the second reference connection electrode 195, the first reference line VREF1 and the third pad VREFP may be connected with each other by the other one. Therefore, since the transparent display panel 110 according to one embodiment of the present disclosure may stably supply the initialization voltage (or sensing voltage) to the subpixels P1, P2 and P3, panel yield may be improved.

Also, the transparent display panel 110 according to one embodiment of the present disclosure may test a defect of the driving transistor T before the anode electrode 120 is deposited.

The transparent display panel 110 may connect the first common power line VSS1 with the second pad VSSP by using only the second common power connection electrode 185 provided in the same layer as the anode electrode 120. Also, the transparent display panel 110 may connect the first reference line VREF1 with the third pad VREFP by using only the second reference connection electrode 195 provided in the same layer as the anode electrode 120.

In this case, a process of testing a defect of the driving transistor T has no choice but to be performed after the anode electrode 120 is deposited. If a defect occurs in the driving transistor T, a repair process may be performed to repair a portion where the defect has occurred. In some embodiments, the layers deposited on the layer where the defect has occurred should be removed to perform the repair process. For example, if the defect occurs in the layer provided with the anode auxiliary electrode 115, the second planarization layer PLN2 and the anode electrode 120 should be removed for the repair process. In some embodiments, luminescence may not be performed in the corresponding area.

In this way, if the repair process is performed after the anode electrode 120 is formed, repair yield is reduced due to the anode electrode 120 and the second planarization layer PLN2 provided over the anode auxiliary electrode 115, and a tact time is increased.

The transparent display panel 110 according to one embodiment of the present disclosure may connect the first common power line VSS1 with the second pad VSSP by using the first common power connection electrode 180 and the second common power connection electrode 185. Also, the transparent display panel 110 according to one embodiment of the present disclosure may connect the first common power line VSS1 with the second pad VSSP through the first common power connection electrode 180 even though the second common power connection electrode 185 is not formed.

The transparent display panel 110 according to one embodiment of the present disclosure may connect the first reference line VREF1 with the third pad VREFP by using the first reference connection electrode 190 and the second reference connection electrode 195. Also, the transparent display panel 110 according to one embodiment of the present disclosure may connect the first reference line VREF1 with the third pad VREFP through the first reference connection electrode 190 even though the second reference connection electrode 195 is not formed.

Therefore, the transparent display panel 110 according to one embodiment of the present disclosure may test a defect of the driving transistor T before the anode electrode 120 is deposited. That is, since the repair process is performed before the second planarization layer PLN2 and the anode electrode 120 are deposited, the transparent display panel 110 according to one embodiment of the present disclosure may prevent repair yield from being reduced due to the second planarization layer PLN2 and the anode electrode 120. In addition, the transparent display panel 110 according to one embodiment of the present disclosure may reduce a tact time.

Hereinafter, the second pixel power line VDD2 and the second common power line VSS2 provided in the second non-display area NDA2 will be described in more detail with reference to FIGS. 9 to 13.

Figure 9:
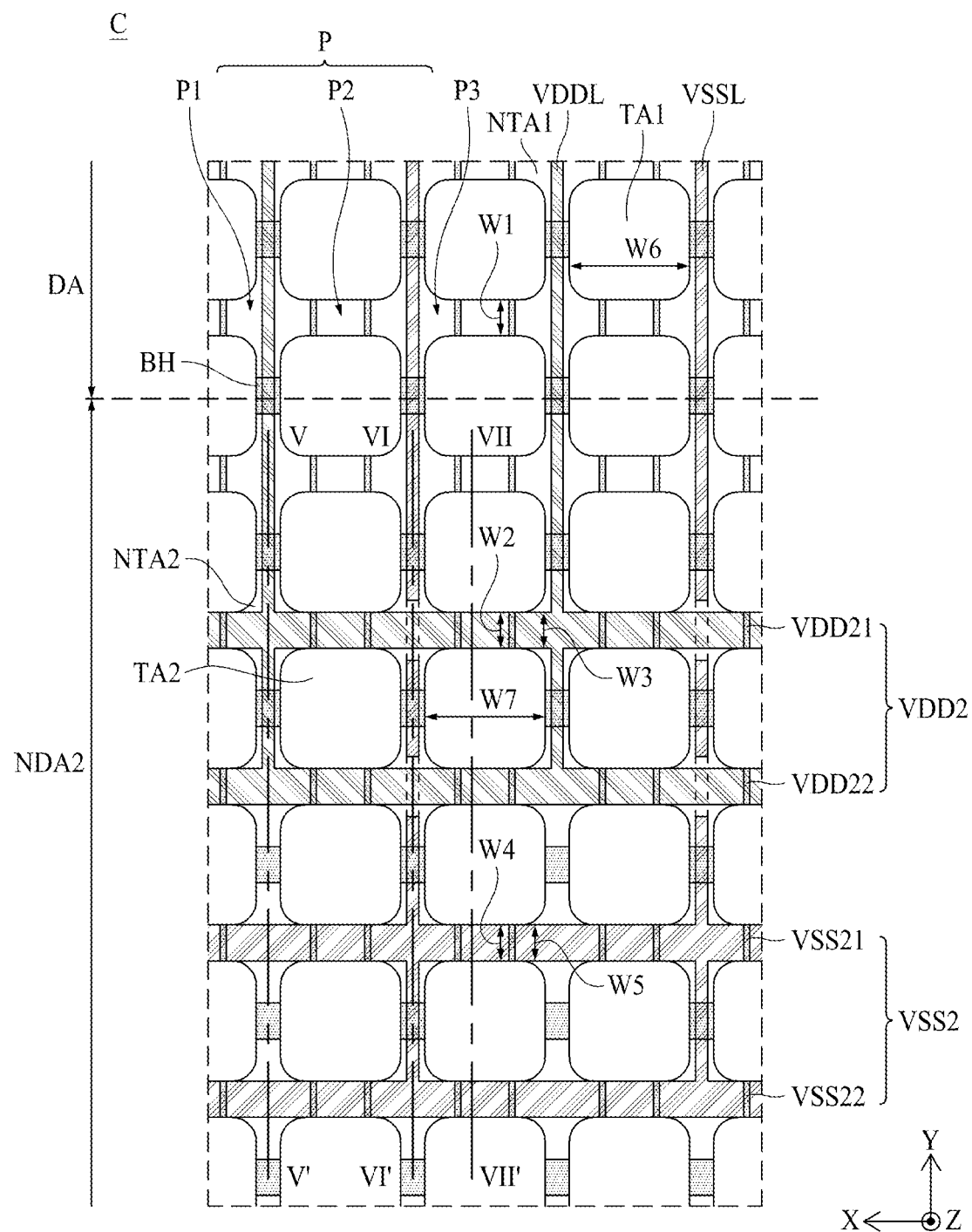
FIG. 9 is an enlarged view of an area C in FIG. 2.
Figure 10:
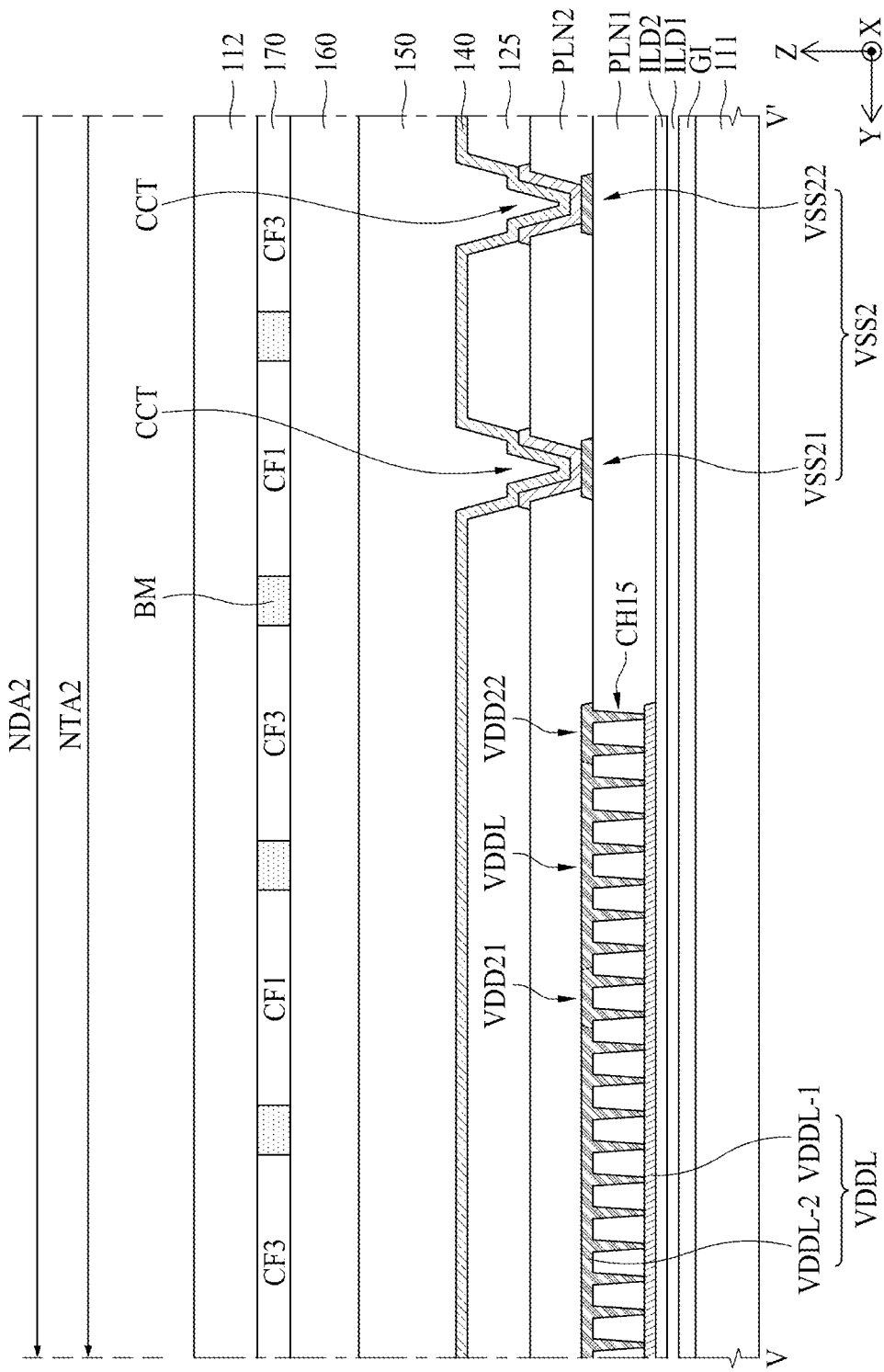
FIG. 10 is a cross-sectional view taken along line V-V' of FIG. 9.
Figure 11:
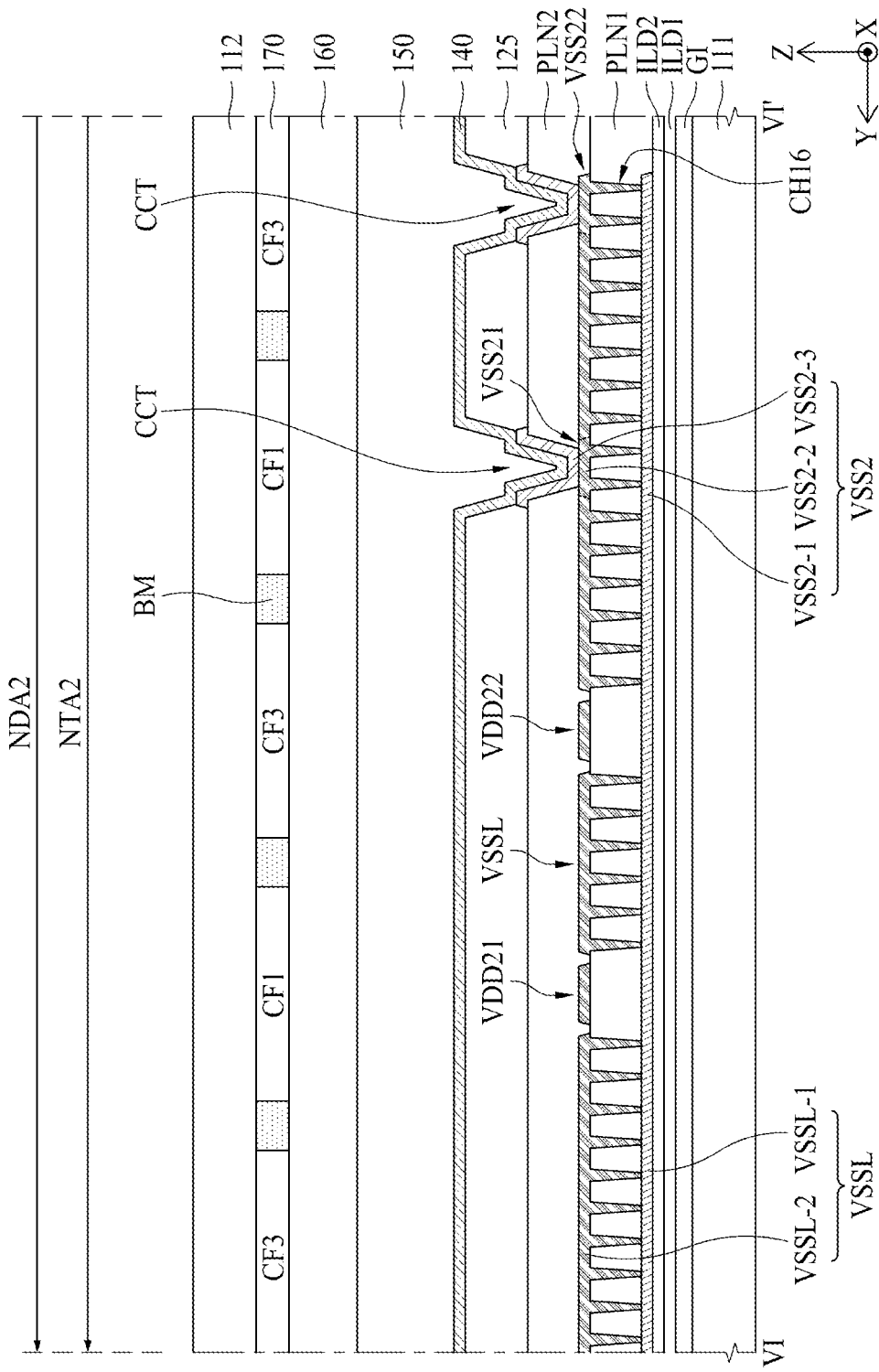
FIG. 11 is a cross-sectional view taken along line VI-VI' of FIG. 9.
Figure 12:
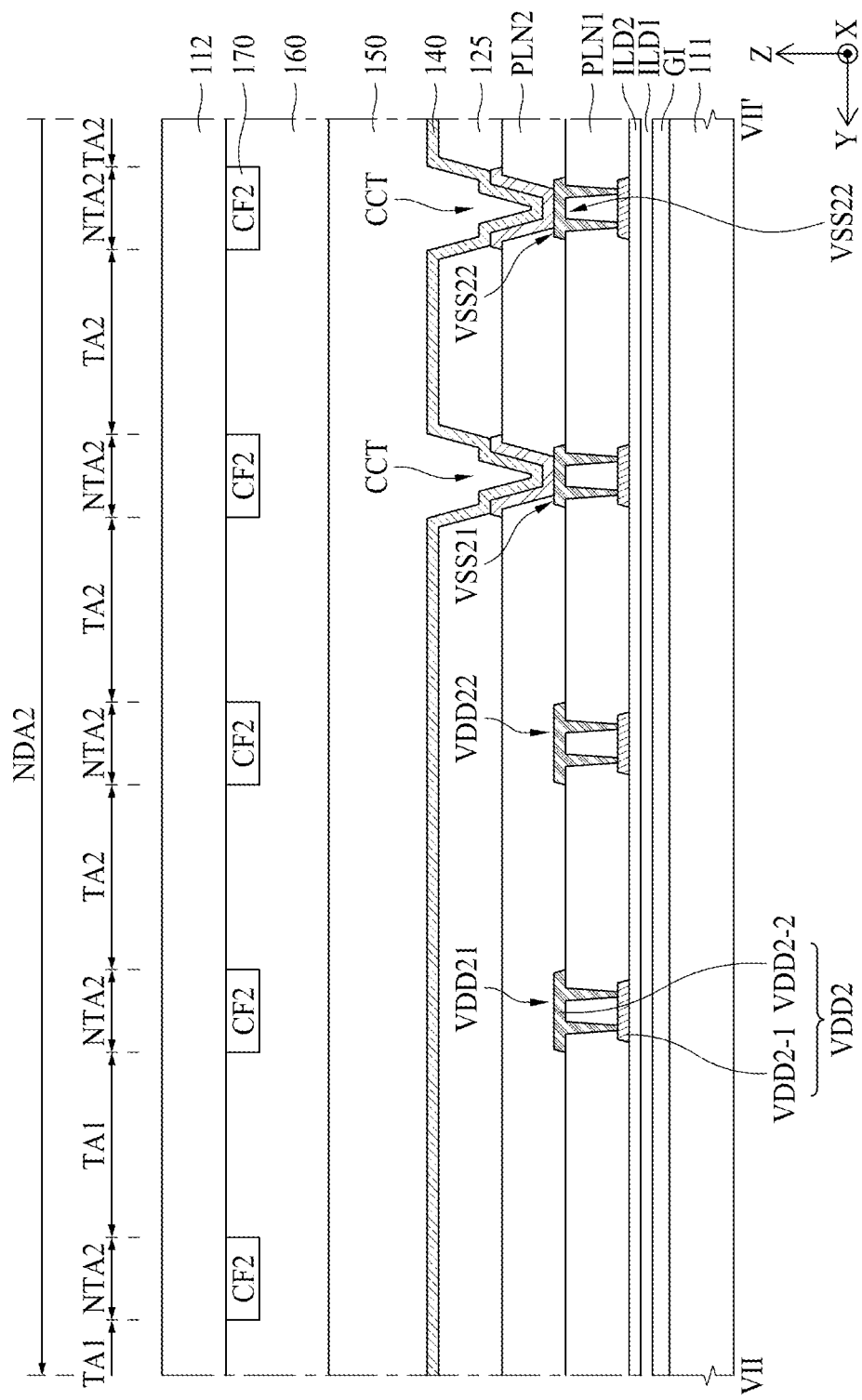
FIG. 12 is a cross-sectional view taken along line VII-VII' of FIG. 9.
Figure 13:
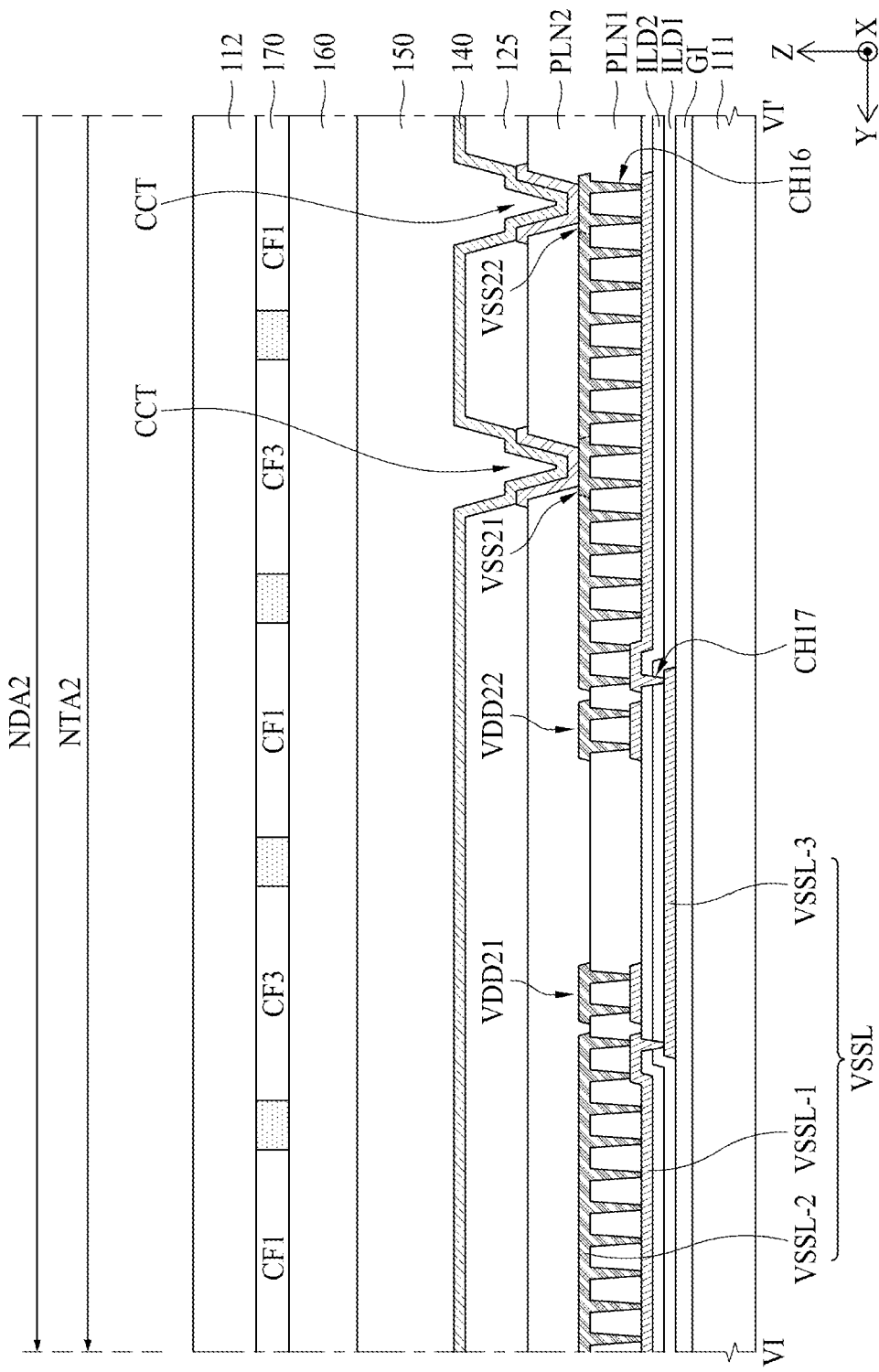
FIG. 13 is a cross-sectional view illustrating a modified example of FIG. 11.

FIG. 9 is an enlarged view of an area C in FIG. 2, FIG. 10 is a cross-sectional view taken along line V-V' of FIG. 9, FIG. 11 is a cross-sectional view taken along line VI-VI' of FIG. 9, FIG. 12 is a cross-sectional view taken along line VII-VII' of FIG. 9, and FIG. 13 is a cross-sectional view illustrating a modified example of FIG. 11.

The display area DA, as shown in FIG. 3, may include first non-transmissive areas NTA1, and first transmissive areas TA1 provided between the first non-transmissive areas NTA1. The first transmissive area TA1 is an area through which most of externally incident light passes, and the first non-transmissive area NTA1 is an area through which most of externally incident light fails to transmit.

The first non-transmissive area NTA1 may be provided with third pixel power lines VDDL, third common power lines VSSL, reference lines, data lines, gate lines GL, and pixels P1, P2 and P3.

The gate lines GL may be extended in a first direction (e.g., X axis direction), and may cross the third pixel power lines VDDL, the third common power lines VSSL and the data lines in the display area DA.

The third pixel power lines VDDL, the third common power lines VSSL, and the data lines may be extended in a second direction (e.g., Y axis direction). In some embodiments, the third pixel power lines VDDL and the third common power lines VSSL may alternately be disposed in the display area DA. The first transmissive area TA1 may be disposed between the third pixel power line VDDL and the third common power line VSSL.

The second non-display area NDA2 may include second non-transmissive areas NTA2, and second transmissive areas TA2 provided between the second non-transmissive areas NTA2. The second transmissive area TA2 is an area through which most of externally incident light passes as it is, and the second non-transmissive area NTA2 is an area through which most of externally incident light fails to transmit.

The second non-transmissive area NTA2 may be provided with second pixel power lines VDD2, second common power lines VSS2, third pixel power lines VDDL and third common power lines VSSL.

The second pixel power line VDD2 may be extended from the second non-display area NDA2 in a first direction (e.g., X axis direction). The second pixel power line VDD2 may be provided in the second non-display area NDA2 in a plural number. The number of second pixel power lines VDD2 may be, but not limited to, 2 as shown in FIG. 9. The number of second pixel power lines VDD2 may be three or more.

One second pixel power line VDD21 is disposed to be spaced apart from the other second pixel power line VDD22. In some embodiments, the second transmissive area TA2 may be provided between one second pixel power line VDD21 and the other second pixel power line VDD22.

The second transmissive area TA2 provided between one second pixel power line VDD21 and the other second pixel power line VDD22 may substantially have the same shape as that of the first transmissive area TA1 provided in the display area DA. In this case, the substantially same shape means that shapes on a plane have the same property. Sizes or rates of the shapes may be equal (or substantially equal) to or different from each other.

For example, the first transmissive area TA1 provided in the display area DA may have a rectangular shape, and may have a rounded corner but is not limited thereto. In this case, the second transmissive area TA2 may also have a rectangular shape, and may have a rounded corner.

In the second non-transmissive area NTA2 provided with one second pixel power line VDD21 and the other second pixel power line VDD22, a width W2 in a second direction transverse to a first direction may be equal (or substantially equal) to a width W1 in a second direction of the first non-transmissive area NTA1 provided in the display area DA. In some embodiments, the second direction is perpendicular to the first direction.

Each of one second pixel power line VDD21 and the other second pixel power line VDD22 may be disposed in the second non-transmissive area NTA2. Therefore, as shown in FIG. 9, each of one second pixel power line VDD21 and the other second pixel power line VDD22 may have a width W3 equal (or substantially equal) to the width W2 of the second non-transmissive area NTA2 or a width W3 narrower than the width W2 of the second non-transmissive area NTA2.

Consequently, the plurality of second pixel power lines VDD2 disposed in the second non-display area NDA2 may have a width W3 equal (or substantially equal) to the width W1 in the second direction of the first non-transmissive area NTA1 provided in the display area DA or a width W3 narrower than the width W1 in the second direction of the first non-transmissive area NTA1.

In the transparent display panel 110 according to one embodiment of the present disclosure, the second pixel power line VDD2 provided in the second non-display area NDA2 does not have a wide width. In the transparent display panel 110 according to one embodiment of the present disclosure, the width W3 of the second pixel power line VDD2 may be formed to be equal (or substantially equal) to or narrower than the width W1 of the first non-transmissive area NTA1 provided in the display area DA, whereby the wide second transmissive area TA2 may be obtained in the second non-display area NDA2.

Meanwhile, in the transparent display panel 110 according to one embodiment of the present disclosure, the second pixel power line VDD2 may be formed in a plural number, whereby a total area of the second pixel power line VDD2 may be increased.

Moreover, in the transparent display panel 110 according to one embodiment of the present disclosure, the second pixel power line VDD2 may be formed of a plurality of metal layers to increase its total area.

In detail, the second pixel power line VDD2 may be provided with a plurality of metal layers. For example, the second pixel power line VDD2, as shown in FIG. 10, may include a first metal layer VDD2-1 and a second metal layer VDD2-2 provided over the first metal layer VDD2-1. The first metal layer VDD2-1 and the second metal layer VDD2-2 may partially be overlapped with each other, and may be connected with each other through a fifteenth contact hole CH15.

In some embodiments, the first metal layer VDD2-1 of the second pixel power line VDD2 may be made of an opaque metal material of low resistance. For example, the first metal layer VDD2-1 of the second pixel power line VDD2 may be provided on the same layer as the source electrode SE and the drain electrode DE of the driving transistor T provided in the display area DA. The first metal layer VDD2-1 may be made of the same material as that of the source electrode SE and the drain electrode DE of the driving transistor T and may be formedsimultaneously with them.

The second metal layer VDD2-2 of the second pixel power line VDD2 may be made of an opaque metal material of low resistance. For example, the second metal layer VDD2-2 of the second pixel power line VDD2 may be provided on the same layer as the anode auxiliary electrode 115 provided in the display area DA. The second metal layer VDD2-2 may be made of the same material as that of the anode auxiliary electrode 115 and may be formed simultaneously with the anode auxiliary electrode 115. In this case, the second metal layer VDD2-2 of the second pixel power line VDD2 may be connected to the first metal layer VDD2-1 through a plurality of fifteenth contact holes CH15 that pass through the first planarization film PLN1.

In the transparent display panel 110 according to one embodiment of the present disclosure, as each of the plurality of second pixel power lines VDD2 provided in the second non-display area NDA2 is provided with a double layer, a total area of the second pixel power line VDD2 may be increased. Therefore, in the transparent display panel 110 according to one embodiment of the present disclosure, even though the width W3 of the second pixel power line VDD2 is formed to be narrow, whereby resistance of the second pixel power line VDD2 may be prevented from being increased.

Also, in the transparent display panel 110 according to one embodiment of the present disclosure, as the second metal layer VDD2-2 of the second pixel power line VDD2 may be connected to the first metal layer VDD2-1 of the second pixel power line VDD2 through the plurality of fifteenth contact holes CH15, the first metal layer VDD2-1 and the second metal layer VDD2-2 may stably be connected with each other.

Each of the third pixel power lines VDDL may be extended from the display area DA in a second direction (e.g., Y axis direction) and connected with the second pixel power line VDD2. The third pixel power line VDDL may be connected to one second pixel power line VDD21 and the other second pixel power line VDD22. In detail, each of the third pixel power lines VDDL may be extended from the display area DA in a second direction (e.g., Y axis direction), and thus may be connected with one end of one second pixel power line VDD21. Also, each of the third pixel power lines VDDL may be extended from the other end of one second pixel power line VDD21 in a second direction (e.g., Y axis direction), and thus may be connected with one end of the other second pixel power line VDD22. Therefore, one second pixel power line VDD21, the other second pixel power line VDD22 and the third pixel power lines VDDL may electrically be connected with one another.

The third pixel power lines VDDL may be formed on the same layer as the second pixel power line VDD2 in the second non-display area NDA2. In detail, the third pixel power line VDDL may include a first metal layer VDDL-1 and a second metal layer VDDL-2 in the second non-display area NDA2. The first metal layer VDDL-1 of the third pixel power line VDDL may be extended from the first metal layer VDD2-1 of the second pixel power line VDD2, and the second metal layer VDDL-2 of the third pixel power line VDDL may be extended from the second metal layer VDD2-2 of the second pixel power line VDD2.

The third pixel power lines VDDL may be extended from the display area DA to only an upper layer VDDL-2.

The second common power line VSS2 may be extended from the second non-display area NDA2 in a first direction (e.g., X axis direction). The second common power line VSS2 may be provided in the second non-display area NDA2 in a plural number. The number of second common power lines VSS2 may be, but not limited to, 2 as shown in FIG. 9. The number of second common power lines VSS2 may be three or more.

One second common power line VSS21 is disposed to be spaced apart from the other second common power line VSS22. In some embodiments, the second transmissive area TA2 may be provided between one second common power line VSS21 and the other second common power line VSS22.

The second transmissive area TA2 provided between one second common power line VSS21 and the other second common power line VSS22 may substantially have the same shape as that of the first transmissive area TA1 provided in the display area DA. In this case, the substantially same shape means that shapes on a plane have the same property. Sizes or rates of the shapes may be equal (or substantially equal) to or different from each other.

For example, the first transmissive area TA1 provided in the display area DA may have a rectangular shape, and may have a rounded corner but is not limited thereto. In this case, the second transmissive area TA2 may also have a rectangular shape, and may have a rounded corner.

In the second non-transmissive area NTA2 provided with one second common power line VSS21 and the other second common power line VSS22, a width W4 in a second direction perpendicular to a first direction may be equal (or substantially equal) to the width W1 in a second direction of the first non-transmissive area NTA1 provided in the display area DA.

Each of one second common power line VSS21 and the other second common power line VSS22 may be disposed in the second non-transmissive area NTA2. Therefore, as shown in FIG. 9, each of one second common power line VSS21 and the other second common power line VSS22 may have a width W5 equal (or substantially equal) to the width W4 of the second non-transmissive area NTA2 or a width W5 narrower than the width W4 of the second non-transmissive area NTA2.

Consequently, the plurality of second common power lines VSS2 disposed in the second non-display area NDA2 may have a width W5 equal (or substantially equal) to the width W1 in the second direction of the first non-transmissive area NTA1 provided in the display area DA or a width W5 narrower than the width W1 in the second direction of the first non-transmissive area NTA1.

In the transparent display panel 110 according to one embodiment of the present disclosure, the second common power line VSS2 provided in the second non-display area NDA2 does not have a wide width. In the transparent display panel 110 according to one embodiment of the present disclosure, the width W5 of the second common power line VSS2 may be formed to be equal (or substantially equal) to or narrower than the width W1 of the first non-transmissive area NTA1 provided in the display area DA, whereby the wide second transmissive area TA2 may be obtained in the second non-display area NDA2.

Meanwhile, in the transparent display panel 110 according to one embodiment of the present disclosure, the second common power line VSS2 may be formed in a plural al number, whereby a total area of the second common power line VSS2 may be increased.

Moreover, in the transparent display panel 110 according to one embodiment of the present disclosure, the second common power line VSS2 may be formed of a plurality of metal layers to increase its total area.

In detail, the second common power line VSS2 may be provided with a plurality of metal layers. For example, the second common power line VSS2, as shown in FIG. 11, may include a first metal layer VSS2-1 and a second metal layer VSS2-2 provided over the first metal layer VSS2-1. The second common power lines VSS2 may further include a third metal layer VSS2-3 provided over the second metal layer VSS2-2. The first metal layer VSS2-1 and the second metal layer VSS2-2 may partially be overlapped with each other, and may be connected with each other through a sixteenth contact hole CH16. At least a part of the third metal layer VSS2-3 may be overlapped with the second metal layer VSS2-2, and may directly be adjacent onto the second metal layer VSS2-2.

In some embodiments, the first metal layer VSS2-1 of the second common power line VSS2 may be made of an opaque metal material of low resistance. For example, the second metal layer VSS2-1 of the second common power line VSS2 may be provided on the same layer as the source electrode SE and the drain electrode DE of the driving transistor T provided in the display area DA. The first metal layer VSS2-1 may be made of the same material as that of the source electrode SE and the drain electrode DE of the driving transistor T and may be formed simultaneously with them.

The second metal layer VSS2-2 of the second common power line VSS2 may be made of an opaque metal material of low resistance. For example, the second metal layer VSS2-2 of the second common power line VSS2 may be provided on the same layer as the anode auxiliary electrode 115 provided in the display area DA. The second metal layer VSS2-2 may be made of the same material as that of the anode auxiliary electrode 115 and may be formed simultaneously with the anode auxiliary electrode 115. In this case, the second metal layer VSS2-2 of the second common power line VSS2 may be connected to the first metal layer VSS2-1 through a plurality of sixteenth contact holes CH16 that pass through the first planarization film PLN1.

The third metal layer VSS2-3 of the second common power line VSS2 may be made of an opaque metal material of low resistance. For example, the third metal layer VSS2-3 of the second common power line VSS2 may be provided on the same layer as the anode electrode 120 provided in the display area DA. The third metal layer VSS2-3 may be made of the same material as that of the anode electrode 120 and may be formed simultaneously with the anode electrode 120.

In the transparent display panel 110 according to one embodiment of the present disclosure, as each of the plurality of second common power lines VSS2 provided in the second non-display area NDA2 is provided with a plurality of layers, a total area of the second common power line VSS2 may be increased. Therefore, in the transparent display panel 110 according to one embodiment of the present disclosure, even though the width W5 of the second common power line VSS2 is formed to be narrow, whereby resistance of the second common power line VSS2 may be prevented from being increased.

Also, in the transparent display panel 110 according to one embodiment of the present disclosure, as the second metal layer VSS2-2 of the second common power line VSS2 may be connected to the first metal layer VSS2-1 of the second common power line VSS2 through the plurality of sixteenth contact holes CH16, the first metal layer VSS2-1 and the second metal layer VSS2-2 may stably be connected with each other.

Meanwhile, each of the second common power lines VSS2 may electrically be connected with the cathode electrode 140 through a cathode contact portion CCT. The cathode contact portion CCT may partially remove the bank 125 and partially expose the upper surface of the third metal layer VSS2-3 of the second common power lines VSS2. The cathode contact portion CCT may longitudinally expose the upper surface of the third metal layer VSS2-3 of the second common power lines VSS2 along the first direction (e.g., X axis direction). As a result, the second common power lines VSS2 may have a wide contact area with the cathode electrode 140, thereby being stably connected to the cathode electrode 140.

Each of the third common power lines VSSL may be extended from the display area DA in a second direction (e.g., Y axis direction) and connected with the second common power line VSS2. The third common power line VSSL may be connected to one second common power line VSS21 and the other second common power line VSS22. In detail, each of the third common power lines VSSL may be extended from the display area DA in a second direction (e.g., Y axis direction), and thus may be connected with one end of one second common power line VSS21. Also, each of the third common power lines VSSL may be extended from the other end of one second common power line VSS21 in a second direction (e.g., Y axis direction), and thus may be connected with one end of the other second common power line VSS22. Therefore, one second common power line VSS21, the other second common power line VSS22 and the third common power lines VSSL may electrically be connected with one another.

The third common power lines VSSL may be formed on the same layer as the second common power line VSS2 in the second non-display area NDA2. In detail, the third common power line VSSL may include a first metal layer VSSL-1 and a second metal layer VSSL-2 in the second non-display area NDA2. The first metal layer VSSL-1 of the third common power line VSSL may be extended from the first metal layer VSS2-1 of the second common power line VSS2, and the second metal layer VSSL-2 of the third common power line VSSL may be extended from the second metal layer VSS2-2 of the second common power line VSS2.

The second pixel power lines VDD2 may be provided between the second common power lines VSS2 and the display area DA as shown in FIG. 9. In this case, the third common power lines VSSL may include one of the first metal layer VSSL-1 and the second metal layer VSSL-2 in the area overlapped with the second pixel power lines VDD2.

For example, the third common power lines VSSL may include only the first metal layer VSSL-1 of the first metal layer VSSL-1 and the second metal layer VSSL-2 in the area overlapped with the second pixel power lines VDD2 as shown in FIG. 11. In some embodiments, the second pixel power lines VSSL may include only the second metal layer VDD2-2 of the first metal layer VDD2-1 and the second metal layer VDD2-2 in the area overlapped with the third common power lines VSSL.

Although FIG. 11 shows that the third common power lines VSSL include any one of the first metal layer VSSL-1 and the second metal layer VSSL-2 in the area overlapped with the second pixel power lines VDD2, the present disclosure is not limited to the example of FIG. 11.

In another embodiment, the third common power lines VSSL, as shown in FIG. 13, may be connected in the area overlapped with the second pixel power lines VDD2 by using the third metal layer VSSL-3 provided over a layer different from the first metal layer VSSL-1 and the second metal layer VSSL-2. The third metal layer VSSL-3 of the third common power lines VSSL may be provided on the same layer as the gate electrode GE of the driving transistor T provided in the display area DA. The third metal layer VSSL-3 may be made of the same material as that of the gate electrode GE of the driving transistor T and may be formed simultaneously with the gate electrode GE. In this case, the third metal layer VSSL-3 of the third common power lines VSSL may be connected to the first metal layer VSSL-1 through a plurality of a seventeenth contact hole CH17 that passes through the first and second inter-layer insulating layers ILD1 and ILD2.

In the transparent display panel 110 according to one embodiment of the present disclosure, the second common power line VSS2 may be formed in a plural number, and the plurality of second common power lines VSS2 may be spaced apart from one another to form the second transmissive area TA2. Also, in the transparent display panel 110 according to one embodiment of the present disclosure, the second pixel power line VDD2 may be formed in a plural number, and the plurality of second pixel power lines VDD2 may be spaced apart from one another to form the second transmissive area TA2. Therefore, in the transparent display panel 110 according to one embodiment of the present disclosure, since the second transmissive area TA2 is also provided in the non-display area NDA2 like the display area DA, transmittance in the second non-display area NDA2 may be improved.

The transparent display panel 110 according to one embodiment of the present disclosure may have similar transmittance in the second non-display area NDA2 and the display area DA common power line VSS2. Accordingly, in some embodiments, in the transparent display panel 110 according to one embodiment of the present disclosure, an area of the first transmissive area TA1 provided in a unit area and an area of the second transmissive area TA2 provided in a unit area may be designed to be equal or substantially equal to each other.

In detail, in one embodiment, the second transmissive area TA2 provided in the second non-display area NDA2 may have the same or substantially the same shape as that of the first transmissive area TA1 provided in the display area DA.

Also, in the transparent display panel 110 according to one embodiment of the present disclosure, a width W7 in the first direction (e.g., X axis direction) of the second transmissive area TA2 provided in the second non-display area NDA2 may be equal (or substantially equal) to a width W6 in the first direction (e.g., X axis direction) of the first transmissive area TAL. This is because that a spaced distance between the third pixel power line VDDL and the third common power line VSSL in the second non-display area NDA2 is equal (or substantially equal) to a spaced distance between the third pixel power line VDDL and the third common power line VSSL. The width in the first direction (e.g., X axis direction) of the transmissive areas TA1 and TA2 may be determined by the spaced distance between the third pixel power line VDDL and the third common power line VSSL.

Also, in the transparent display panel 110 according to one embodiment of the present disclosure, a width W2 in the second direction (e.g., Y axis direction) of the second non-transmissive area NTA2 provided in the second non-display area NDA2 may be equal (or substantially equal) to the width W1 in the second direction (e.g., Y axis direction) of the first non-transmissive area NTA1.

Therefore, in the transparent display panel 110 according to one embodiment of the present disclosure, transmittance similar to that in the display area DA may be embodied in the second non-display area NDA2.

Moreover, the transparent display panel 110 according to one embodiment of the present disclosure may further include a color filter layer 170 and a black matrix BM in the second non-transmissive area NTA2 of the second non-display area NDA2.

In more detail, color filters CF1, CF2 and CF3 formed over the second pixel power line VDD2, the second common power line VSS2, the third pixel power lines VDDL and the third common power lines VSSL, and the black matrix BM formed among the color filters CF1, CF2 and CF3 may be provided in the second non-transmissive area NTA2 of the second non-display area NDA2. In some embodiments, the color filters CF1, CF2 and CF3 may be formed to be patterned in the second non-display area NDA2 in the same shape as that of the color filters CF1, CF2 and CF3 provided in the display area DA.

The color filter layer 170 and the black matrix BM may not be provided in the second transmissive area TA2 of the second non-display area NDA2 as shown in FIG. 12 to enhance transmittance.

Therefore, in the transparent display panel 110 according to one embodiment of the present disclosure, a difference between transmittance in the second non-display area NDA2 and transmittance in the display area DA may be reduced or minimized.

Meanwhile, in the transparent display panel 110 according to one embodiment of the present disclosure, the pixel power line VDD, the common power line VSS and the reference line VREF may be provided in only the first non-display area NDA1 and the second non-display area NDA2 of the non-display area NDA. In the transparent display panel 110 according to one embodiment of the present disclosure, each of the pixel power line VDD, the common power line VSS and the reference line VREF may be formed in a double layer structure, and each of the common power line VSS and the reference line VREF provided in the first non-display area NDA1 may be connected with a plurality of connection electrodes. Therefore, even though the pixel power line VDD, the common power line VSS and the reference line VREF are provided in only the first non-display area NDA1 and the second non-display area NDA2, the transparent display panel 110 according to one embodiment of the present disclosure may make sure of a sufficient area of each of the pixel power line VDD, the common power line VSS and the reference line VREF and reduce or minimize resistance.

In the transparent display panel 110 according to one embodiment of the present disclosure, as the pixel power line VDD, the common power line VSS and the reference line VREF are not provided in the third non-display area NDA3 and the fourth non-display area NDA4, transmittance in the third non-display area NDA3 and the fourth non-display area NDA4 may be improved. That is, the transparent display panel 110 according to one embodiment of the present disclosure may have transmittance even in the third non-display area NDA3 and the fourth non-display area NDA4, which is similar to that of the display area DA.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to cover all variations or modifications derived from the meaning, scope, and equivalent concept disclosed within the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device, comprising:
a substrate provided with a display area and a non-display area adjacent to the display area;
a plurality of subpixels disposed in the display area;
an anode electrode provided in each of the plurality of subpixels on the substrate;
a light emitting layer on the anode electrode;
a cathode electrode on the light emitting layer;
a plurality of power lines on the substrate and extended in a first direction, the plurality of power lines including:
a plurality of first common power lines supplying a first power source to the cathode electrode; and
a plurality of first pixel power lines supplying a second power source to the anode electrode in the non-display area;
a plurality of second common power lines extended from the display area in a second direction and electrically connected with the plurality of first common power lines, respectively; and
a plurality of second pixel power lines extended from the display area in the second direction and electrically connected with the plurality of first pixel power lines, respectively;
wherein the display area includes first non-transmissive areas and a first transmissive area provided between the first non-transmissive areas,
wherein the non-display area includes a second transmissive area provided between the plurality of power lines, and
wherein the second pixel power lines and the second common power lines are alternately disposed in the display area, and the first transmissive area is provided between the second pixel power line and the second common power line.

2. The transparent display device of claim 1, wherein the first transmissive area and the second transmissive area have substantially the same width in the first direction.

3. The transparent display device of claim 1, wherein the first transmissive area provided in a unit area has substantially the same area as that of the second transmissive area provided in the unit area.

4. The transparent display device of claim 1, wherein the non-display area further includes second non-transmissive area provided with the plurality of power lines.

5. The transparent display device of claim 4, wherein each of the plurality of power lines has a width substantially equal to or narrower than that of the second direction transverse to the first direction of the second non-transmissive area.

6. The transparent display device of claim 4, further comprising a color filter on the plurality of power lines in the second non-transmissive area.

7. The transparent display device of claim 4, further comprising:
a cathode contact portion electrically connecting the cathode electrode with the first common power line,
wherein the cathode contact portion is provided in the second non-transmissive area.

8. The transparent display device of claim 1, wherein the first common power line includes a first metal layer and a second metal layer on the first metal layer, and wherein at least a part of the second metal layer is overlapped with the first metal layer, and is electrically connected to the first metal layer through a plurality of contact holes.

9. The transparent display device of claim 1, further comprising:
a driving transistor including an active layer, a gate electrode, a source electrode, and a drain electrode,
wherein the driving transistor is provided between the anode electrode and the substrate in the display area,
wherein the first common power line includes a first metal layer and a second metal layer on the first metal layer, and
wherein one of the first metal layer and the second metal layer of the first common power line is made of the same material as that of the source electrode and the drain electrode on the same layer as the source electrode and the drain electrode.

10. The transparent display device of claim 1, further comprising:
a plurality of gate lines provided to overlap the plurality of second common power lines and the plurality of second pixel power lines in the display area,
wherein the plurality of subpixels includes a first subpixel provided to overlap a first overlapping area where the second common power line and the gate line overlap each other, a third subpixel provided to overlap a second overlapping area where the second pixel power line and the gate line overlap each other, and a second subpixel provided between the first subpixel and the third subpixel.

11. The transparent display device of claim 1, wherein the non-display area includes a first non-display area provided with a plurality of pads, and a second non-display area disposed in parallel with the first non-display area by interposing the display area, and the second transmissive area are disposed in the second non-display area.

12. The transparent display device of claim 1, wherein the first transmissive area and the second transmissive area have the same or substantially the same shape.

13. The transparent display device of claim 1, wherein the plurality of power lines on the substrate extends in parallel in the first direction.

14. A transparent display device, comprising:
a substrate provided with a display area, a first non-display area, and a second non-display area disposed in parallel with the first non-display area by interposing the display area;
a plurality of subpixels disposed in the display area;
a pad disposed in the first non-display area;
an anode electrode provided in each of the plurality of subpixels on the substrate;
a light emitting layer on the anode electrode;
a cathode electrode on the light emitting layer;
a plurality of first common power lines provided in the second non-display area on the substrate and electrically connected with the cathode electrode;
a plurality of first pixel power lines provided in the second non-display area on the substrate and electrically connected with the anode electrode;
a plurality of second common power lines extended from the display area to the second non-display area in the second direction and electrically connected with the plurality of first common power lines, respectively,
a third common power line provided in the first non-display area on the substrate and electrically connected with the cathode electrode;

a first common power connection electrode electrically connecting the second common power line with the pad; and a second common power connection electrode disposed on a layer different from the first common power connection electrode, electrically connecting the second common power line with the pad, wherein the second non-display area includes a second transmissive area provided between the plurality of first common power lines-, and wherein the first common power connection electrode is provided between the third common power line and the substrate, and the second common power connection electrode is provided on the third common power line.

15. The transparent display device of claim 14, wherein the second non-display area further includes second non-transmissive area provided with the plurality of power lines, and wherein the first common power lines have a width equal to or less than that of the second non-transmissive area.

16. The transparent display device of claim 14, wherein the plurality of first common power lines is respectively extended in parallel in the second non-transmissive area, and the display area includes first non-transmissive areas provided with the plurality of subpixels and a first transmissive area, and the first transmissive area and the second transmissive area have the same or substantially the same width in the first direction.

17. The transparent display device of claim 16, wherein the first transmissive area and the second transmissive area have the same or substantially the same shape.

18. The transparent display device of claim 14, wherein the second common power connection electrode is provided on the same layer as the anode electrode.

* * * * *